(12) United States Patent
Tufty et al.

(10) Patent No.: US 10,390,458 B2
(45) Date of Patent: Aug. 20, 2019

(54) LIQUID SUBMERSION COOLED ELECTRONIC SYSTEMS AND DEVICES

(71) Applicant: LiquidCool Solutions, Inc., Rochester, MN (US)

(72) Inventors: Lyle Rick Tufty, Rochester, MN (US); Gary Allan Reed, Rochester, MN (US); Sean Michael Archer, Rochester, MN (US); Rafael Alba, Rochester, MN (US)

(73) Assignee: LIQUIDCOOL SOLUTIONS, INC., Rochester, MN (US)

( * ) Notice: Subject to any disclaimer, the term of this patent is extended or adjusted under 35 U.S.C. 154(b) by 0 days.

(21) Appl. No.: 16/137,015

(22) Filed: Sep. 20, 2018

(65) Prior Publication Data

US 2019/0090383 A1 Mar. 21, 2019

Related U.S. Application Data

(60) Provisional application No. 62/560,937, filed on Sep. 20, 2017.

(51) Int. Cl.
*H05K 7/20* (2006.01)

(52) U.S. Cl.
CPC ..... *H05K 7/20236* (2013.01); *H05K 7/20263* (2013.01); *H05K 7/20272* (2013.01); *H05K 7/20772* (2013.01)

(58) Field of Classification Search
CPC ........... H05K 7/20236; H05K 7/20772; H05K 7/20272; H05K 7/20263
See application file for complete search history.

(56) References Cited

U.S. PATENT DOCUMENTS

| | | | |
|---|---|---|---|
| 7,901,106 B2 | 3/2011 | Duncan et al. | |
| 7,905,106 B2* | 3/2011 | Attlesey | G06F 1/20 165/104.33 |
| 7,911,793 B2 | 3/2011 | Attlesey | |
| 8,089,764 B2 | 1/2012 | Attlesey | |
| 8,184,436 B2* | 5/2012 | Campbell | H05K 7/203 361/700 |
| 8,467,189 B2* | 6/2013 | Attlesey | G06F 1/20 165/80.4 |
| 9,042,099 B2* | 5/2015 | Campbell | H05K 7/20781 165/104.33 |
| 9,426,927 B2* | 8/2016 | Shafer | H05K 7/20236 |
| 9,451,726 B2* | 9/2016 | Regimbal | H05K 7/20236 |

(Continued)

OTHER PUBLICATIONS

"Freeing HPC From the Datacentre—KU:L SISTEM", obtained from http://www.iceotope.com/rackservers/; date is unknown—in Applicant's possession about Aug. 5, 2018; 9 pages.

*Primary Examiner* — Anthony M Haughton
*Assistant Examiner* — Yahya Ahmad
(74) *Attorney, Agent, or Firm* — Hamre, Schumann, Mueller & Larson, P.C.

(57) ABSTRACT

Liquid submersion cooling systems are described that use a cooling liquid, for example a dielectric cooling liquid, to submersion cool an array of electronic devices. In some embodiments described herein, rather than using pump pressure to return the cooling liquid back to a cooling liquid reservoir, gravity can be used to return the cooling liquid to a reservoir via a cooling liquid gravity return manifold, and a pump can only be used on the liquid supply side to deliver the cooling liquid to each electronic device.

10 Claims, 26 Drawing Sheets

(56) References Cited

U.S. PATENT DOCUMENTS

| | | | |
|---|---|---|---|
| 10,257,963 B2* | 4/2019 | Ozyalcin | H05K 7/20236 |
| 10,271,456 B2* | 4/2019 | Tufty | H05K 7/20236 |
| 2014/0085821 A1* | 3/2014 | Regimbal | H05K 7/20236 |
| | | | 361/699 |
| 2019/0090383 A1* | 3/2019 | Tufty | H05K 7/20236 |

* cited by examiner

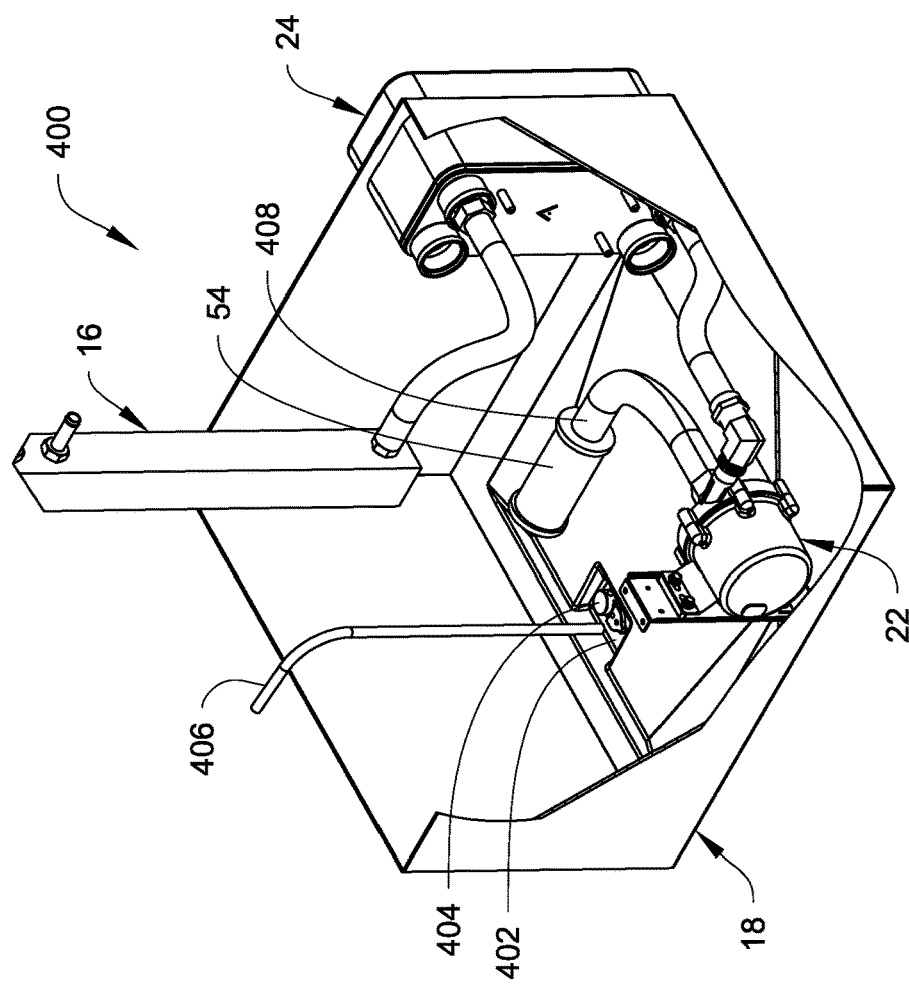
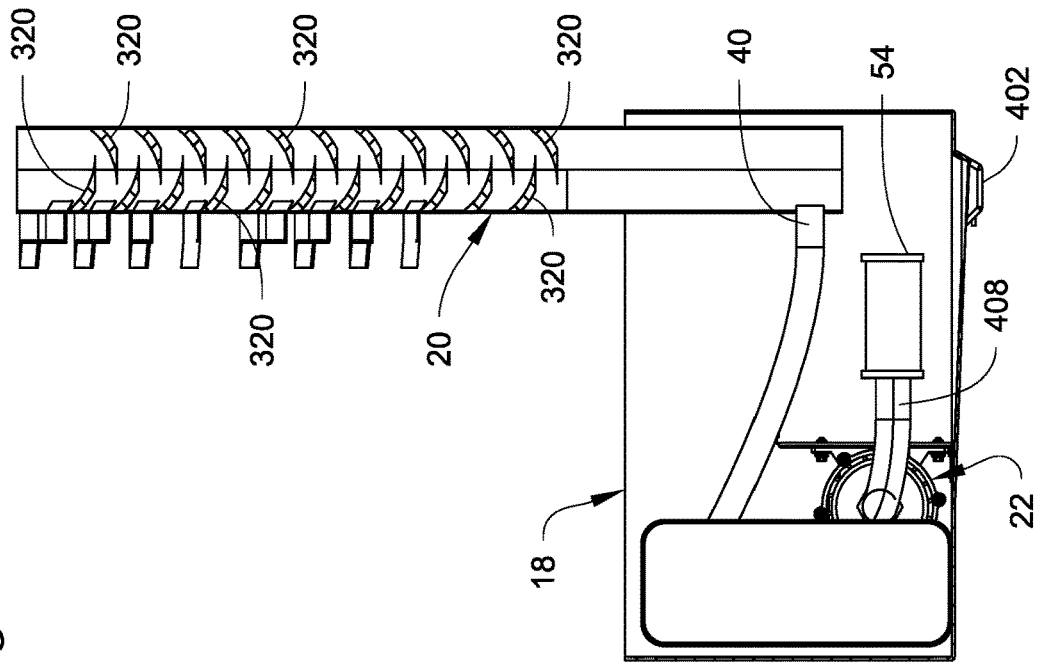

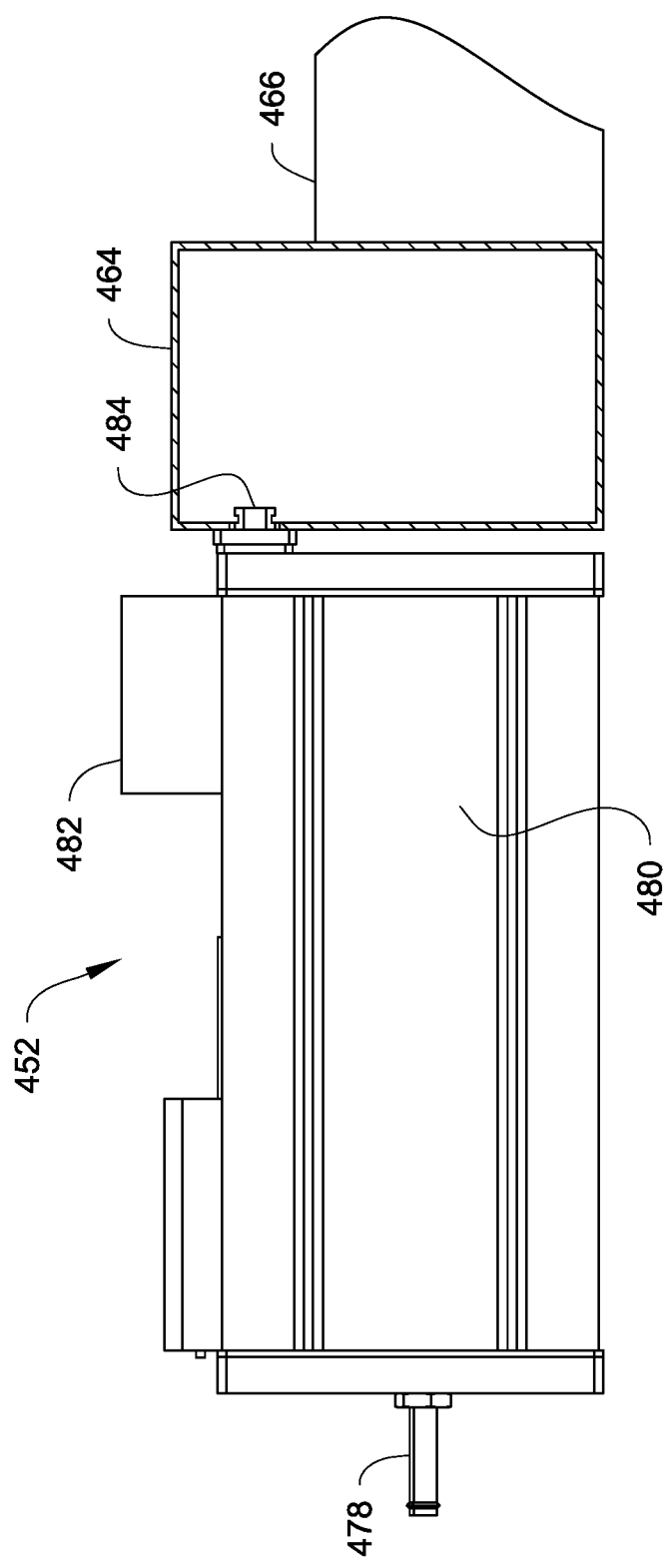

LIQUID SUBMERSION COOLED ELECTRONIC SYSTEMS AND DEVICES

FIELD

This disclosure relates to liquid submersion cooling of electronic array systems and devices.

BACKGROUND

Liquid submersion cooled electronic systems and devices are known. One example of an array of liquid submersion cooled electronic devices is an array of liquid submerged servers (LSS's) arranged in a rack system. An example of an array of LSS's in a rack system is disclosed in U.S. Pat. Nos. 7,905,106, 7,911,793, and 8,089,764. Another example of an array of liquid submersion cooled electronic devices is disclosed in U.S. Pat. No. 9,451,726.

SUMMARY

Liquid submersion cooling systems are described that use a cooling liquid, for example a dielectric cooling liquid, to submersion cool an array of electronic devices. In some embodiments described herein, rather than using pump pressure to return the cooling liquid back to a cooling liquid reservoir, gravity can be used to return the cooling liquid to a reservoir via a cooling liquid gravity return manifold, and a pump can only be used on the liquid supply side to deliver the cooling liquid to each electronic device.

In one example described herein, the electronic devices can each include a device housing that is formed by a tray which can have a completely or partially open top. A plurality of heat generating electronic components are disposed within the interior space of the device housing, with at least some of the heat generating electronic components being submerged within cooling liquid in the device housing. In addition to being submerged in the cooling liquid, a returning supply flow of the cooling liquid may also be directed onto one or more of the heat generating electronic components in what may be referred to as directed flow.

In one embodiment, a liquid submersion cooled electronic device includes a device housing defining an interior space and a maximum dielectric cooling liquid level. Heat generating electronic components are disposed within the interior space of the device housing, and a dielectric cooling liquid is in the interior space with the dielectric cooling liquid submerging and in direct contact with the heat generating electronic components. A dielectric cooling liquid inlet is in the device housing through which dielectric cooling liquid enters the interior space. In addition, a dielectric cooling liquid outlet weir is formed in the device housing from which dielectric cooling liquid exits the interior space without using pump pressure on the return side. The dielectric cooling liquid outlet weir is disposed at the maximum dielectric cooling liquid level of the device housing wherein the cooling liquid outlet weir establishes the level of the dielectric cooling liquid within the interior space and establishes a volumetric rate of flow of the dielectric cooling liquid within the interior space that is needed for the cooling of the heat generating electronic components.

A liquid submersion cooled electronic system can include a plurality of the liquid submersion cooled electronic devices, as well as a dielectric cooling liquid delivery manifold, a dielectric cooling liquid reservoir, a pump, and a dielectric cooling liquid gravity return manifold. The dielectric cooling liquid delivery manifold includes at least one inlet, and a plurality of delivery outlets, and each one of the delivery outlets is fluidly connected to the dielectric cooling liquid inlet of a respective one of the dielectric cooling liquid inlets to deliver the dielectric cooling liquid to the interior space of the respective device housing. The dielectric cooling liquid reservoir that is configured to supply the dielectric cooling liquid. The pump has a pump inlet that is fluidly connected to the dielectric cooling liquid reservoir and a pump outlet that is fluidly connected to the at least one inlet of the dielectric cooling liquid delivery manifold. In addition, each one of the dielectric cooling liquid outlet weirs are fluidly connected to the dielectric cooling liquid gravity return manifold, and the dielectric cooling liquid gravity return manifold is fluidly connected to the dielectric cooling liquid reservoir, whereby the dielectric cooling liquid that exits through the dielectric cooling liquid outlet weirs is returned by gravity to the dielectric cooling liquid reservoir by the dielectric cooling liquid gravity return manifold.

One example application of the liquid submersion cooling devices and systems described herein is for use with an array of LSS's arranged in a rack system. However, the concepts described herein can be used in other applications where arrays of electronic devices are liquid submersion cooled, including, but not limited to, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, etc.

The liquid submersion cooling devices and systems described herein can be used in any area that could benefit from the advantages of liquid submersion cooling. In one example, the liquid submersion cooling devices and systems can be used in blockchain computing (cryptocurrency) applications, for example in either ASIC or GPU computer mining configurations. The liquid submersion cooling devices and systems can also be used in deep learning applications, for example in multi-GPU configurations supporting maximum bandwidth and direct memory access (DMA) of high performance GPUs. The liquid submersion cooling devices and systems can also be used in artificial intelligence and high-performance computing (HPC) clusters with multiple co-processor configurations, for example multi-GPU configurations supporting DMA capabilities of GPU co-processors. Many other applications and uses of the liquid submersion cooling devices and systems described herein are possible and contemplated.

The liquid submersion cooling devices and systems described herein do not require fully sealed electronic device housings. Instead, the trays that contain the electronics can be completely or partially open at the tops thereof helping to, when compared to systems that use fully sealed electronic device housings, reduce costs, and simplifying access to the electronics for service and modifications. Liquid submersion cooling also has superior cooling efficiency compared to air cooling.

DRAWINGS

FIG. 12 illustrates details of the interior of the gravity return manifold in the system of FIG. 8.

FIG. 13 is a perspective view of a portion of another embodiment of a liquid submersion cooling system described herein with the electronic devices removed and with a water collection well formed in the bottom of the reservoir.

FIG. 19 is a side view of the electronic device of FIGS. 17 and 18 and its interaction with the horizontal return manifold.

DETAILED DESCRIPTION

Figure 1:
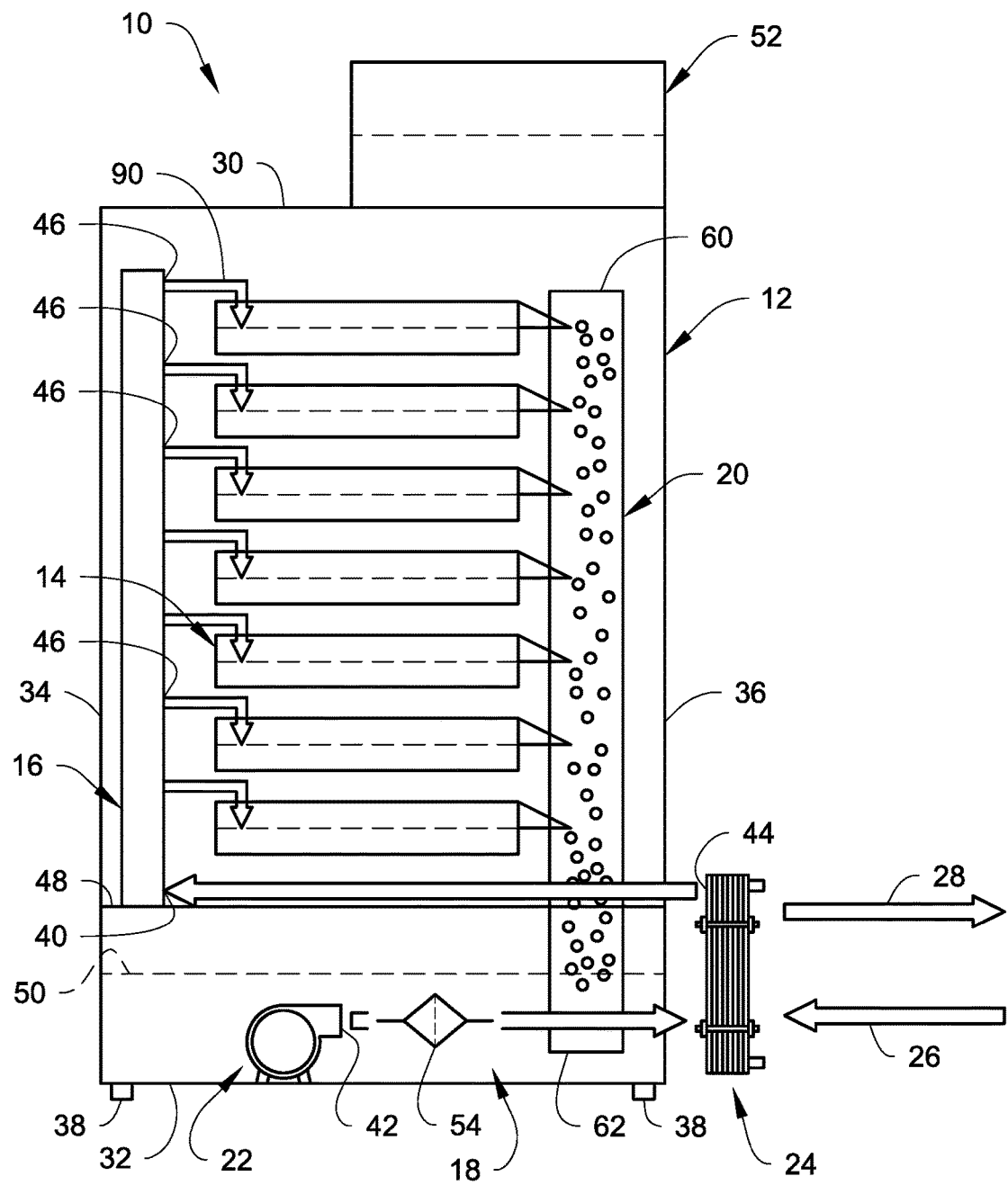
FIG. 1 is a schematic side view of an example of a liquid submersion cooled electronic system described herein.

Referring to FIG. 1, one example of a liquid submersion cooled electronic system 10 is illustrated. The system 10 includes a housing 12 and at least one column of electronic devices 14 disposed within the housing 12. A fluid delivery system is used to deliver cooling liquid through the system 10. The fluid delivery system includes a cooling liquid delivery manifold 16 that delivers cooling liquid to the electronic devices 14 from a cooling liquid reservoir 18 for liquid submersion cooling of heat generating electronic components of the electronic devices 14, and a cooling liquid gravity return manifold 20 that returns cooling liquid from the electronic devices 14 back into the cooling liquid reservoir 18 using gravity. A pump 22 pumps the cooling liquid from the reservoir 18 to the delivery manifold 16.

The fluid delivery system delivers the cooling liquid through the system 10. For example, the pump 22 pumps the cooling liquid from the reservoir 18 to the delivery manifold 16. The cooling liquid is then delivered from the delivery manifold 16 into each electronic device 14. The cooling liquid then exits the electronic devices 14 and is discharged into the gravity return manifold 20, where gravity then returns the cooling liquid into the reservoir 18.

The cooling liquid used to cool the electronics in the electronic devices 14 can be, but is not limited to, a dielectric liquid. The cooling liquid can be single phase or two-phase. Single phase dielectric cooling liquid is preferred. It is preferred that the cooling liquid have a high enough thermal transfer capability to handle the amount of heat being generated by the submerged heat generating electronic components so that the cooling liquid does not change state. Submersion cooling of the heat generating electronic components means that enough of the cooling liquid is present so that the heat generating electronic components are submerged in the cooling liquid in direct intimate contact with the cooling liquid.

The cooling liquid being returned back to the reservoir 18 is at a higher temperature than the cooling liquid delivered to the electronic devices 14 since the cooling liquid picks up heat from the heat generating electronic devices. In some embodiments, the returned cooling liquid may be sufficiently cooled through ambient heat exchange with the environment while sitting in the reservoir 18. In other embodiments, where additional cooling is required, the cooling liquid can be directed through a heat exchanger prior to being delivered back to the electronic devices 14.

For example, as illustrated in FIG. 1, a heat exchanger 24 can be provided that has a heat exchanger inlet fluidly connected to an outlet of the pump 22 and an outlet of the heat exchanger 24 is connected to an inlet of the delivery manifold 16 so that the cooling liquid is cooled prior to entering the delivery manifold 16. The heat exchanger 24 can be any heat exchanger that can reduce the temperature of the cooling liquid prior to being delivered to the electronic devices 14. For example, the heat exchanger 24 can be a liquid-to-liquid heat exchanger where a heat exchange liquid, including but not limited to a water/glycol mix, is used to exchange heat with the cooling liquid prior to delivery to the delivery manifold 16. The heat exchange liquid can be supplied to the heat exchanger 24 via a supply 26 and returned via a return 28. In other embodiments, the heat exchanger 24 may be a liquid-air heat exchanger where the cooling liquid is cooled by exchanging heat with ambient air, optionally supplemented by a fan that can move air across the heat exchanger 24. The heat exchanger 24 can be mounted within the reservoir 18, or on the reservoir 18, or the heat exchanger 24 can be separate from the housing 12.

In the illustrated example, the delivery manifold 16, the reservoir 18, the gravity return manifold 20, and the pump 22 are shown as being disposed within the housing 12.

However, one or more of the delivery manifold 16, the reservoir 18, the gravity return manifold 20, and the pump 22 can be located outside of the housing 12 as long as the cooling liquid can be delivered to and returned from the electronic devices 14.

The housing 12 can have any configuration that is suitable for enclosing the electronic devices 14. The housing 12 is preferably enclosed in a manner that minimizes infiltration of dust, bugs, and other foreign contaminants into the interior of the housing 12 that might compromise the cooling liquid, the operation of the fluid delivery system, or the operation of the electronics of the electronic devices 14. For example, the housing 12 can have a top panel 30, a bottom panel 32 opposite the top panel 30, a rear panel 34, a front panel 36 opposite the rear panel 34, and opposite side panels (not shown) defining a generally rectangular enclosure defining an interior space. The interior space of the housing 12 can include vertically spaced shelves or racks which support the electronic devices 14.

The front panel 36 may be hinged to the housing 12 to act as a door that can be opened and closed to permit access to the electronic devices 14, the fluid delivery system and other components of the system 10. EMI gaskets or seals may be provided on the housing 12 to satisfy FCC emissions or susceptibility requirements. Sound proofing may also be added to the housing 12 to minimize system noise transmission to the surrounding environment. The bottom panel 32 may be provided with leveling features 38, such as adjustable leveling feet or other leveling features, to permit the housing 12, and the electronic devices 14 therein, to be leveled.

The delivery manifold 16 is illustrated as being oriented generally vertically with a longitudinal axis thereof parallel to a stacking direction of the electronic devices 14. The gravity return manifold 20 is also illustrated as being oriented generally vertically with a longitudinal axis thereof parallel to the stacking direction of the electronic devices 14 and parallel to the longitudinal axis of the delivery manifold 16.

The delivery manifold 16 extends substantially the height of the electronic devices 14 or greater, and includes at least one cooling liquid inlet 40 adjacent a base end thereof that is in fluid communication with an outlet 42 of the pump 22, for example via the heat exchanger outlet 44. The delivery manifold 16 also includes a plurality of liquid delivery outlets 46 spaced along the length thereof, such as at least one delivery outlet 46 for each electronic device 14. Each one of the liquid delivery outlets 46 is fluidly connected to the associated electronic device 14 to deliver the cooling liquid to each electronic device 14.

The reservoir 18 is illustrated as being located at a base of the housing 12. An internal wall 48 separates the interior of the housing 12 into an upper space that contains the electronic devices 14 and a lower space that contains the reservoir 18. The broken line in FIG. 1 depicts the level 50 of the cooling liquid within the reservoir 18.

FIG. 1 also illustrates an optional upper cooling liquid reservoir 52 that can be provided above the housing 12. The liquid reservoir 52 can be used in a gravity fed system where gravity is used to feed the cooling liquid to the electronic devices 14 instead of using the pump 22. The pump 22 would move the cooling liquid from the lower reservoir 18 to the upper reservoir 52 which would then feed the vertical delivery manifold 16 by gravity. In another embodiment described further below, the upper reservoir 52 may serve as an accumulator/pressure tank to provide a buffer volume for a constant pressure cooling liquid delivery scheme.

The pump 22 is illustrated as being submerged in the cooling liquid in the reservoir 18. However, the pump 22 can be located outside of the reservoir 18 as well. The pump 22 has a pump inlet (not shown) that is open to the cooling liquid in the reservoir 18 to intake cooling liquid, and the outlet 42 is fluidly connected to the cooling liquid inlet 40 of the delivery manifold 16, for example via the heat exchanger 24. An optional filter 54 can be provided to filter the cooling liquid prior to being delivered to the electronic devices 14. The filter 54 can also be provided on the pump inlet.

The gravity return manifold 20 extends substantially the height of the electronic devices 14 or greater, with an upper end 60 located at about the uppermost one of the electronic devices 14. In the example illustrated in FIG. 1, a lower end 62 of the return manifold 20 is disposed within the reservoir 18 and submerged within the cooling liquid beneath the level 50 thereof. After cooling electronic components in the electronic devices 14, cooling liquid is discharged from the electronic devices into the manifold 20. The returning cooling liquid is then returned via gravity back into the bulk cooling fluid within the reservoir 18.

The electronic devices 14 can be configured as any array of electronic devices that are liquid submersion cooled. For example, the electronic devices 14 can be LSS's, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, and the like, and any combinations thereof.

Figure 2:
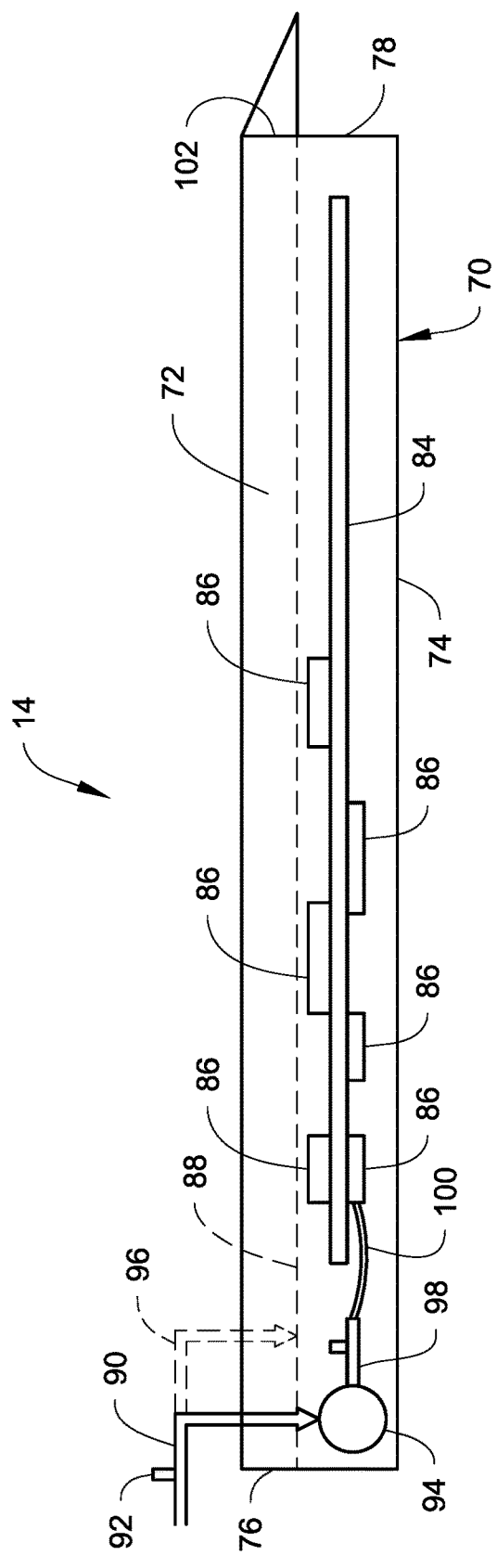
FIG. 2 is a schematic side view of one of the liquid submersion cooled electronic devices described herein.
Figure 3:
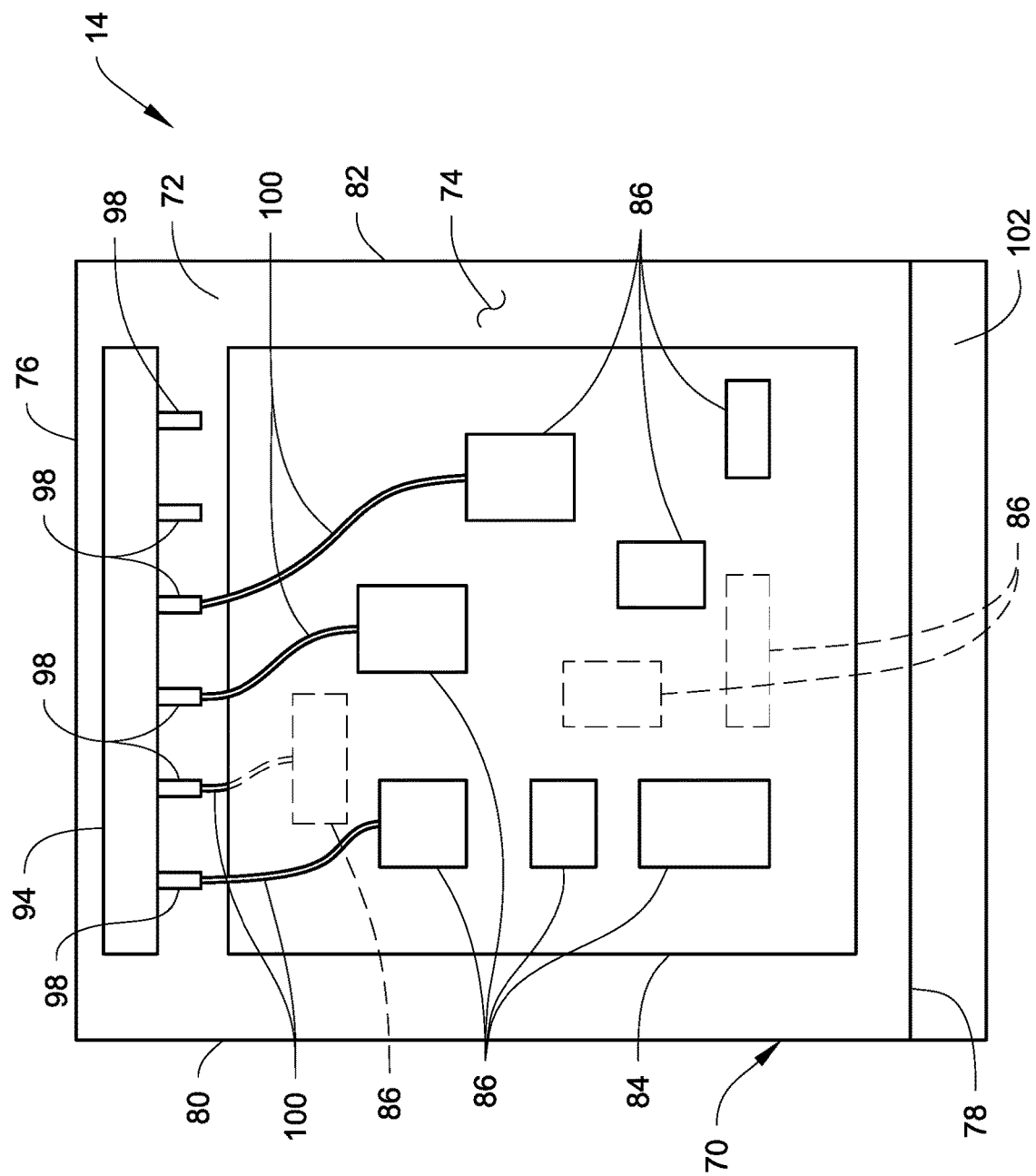
FIG. 3 is a schematic top view of one of the electronic devices described herein.

An example configuration of one of the electronic devices 14 is illustrated in FIGS. 2 and 3. Each of the other electronic devices 14 can have a similar construction. The electronic device 14 includes a device housing 70 defining an interior space 72. In the illustrated example, the device housing 70 is in the form of a tray that has a completely or partially open top. The tray can be round, triangular, square, rectangular, or any other shape. The illustrated tray is rectangular and has a bottom panel 74, a first end panel 76, a second end panel 78 opposite the first end panel 76, a first side panel 80, and a second side panel 82 opposite the first side panel. The top of the tray opposite the bottom panel 74 is completely or partially open meaning that a panel or other closure does not close the top. The bottom panel 74, the end panels 76, 78 and the side panels 80, 82 form the interior space 72 in which electronic components and the cooling liquid will be contained. The tray is liquid tight to prevent unintended leakage of cooling liquid from the housing 70.

At least one circuit board 84 having heat-generating electronic components 86 mounted thereon is disposed in the interior space 72 of the housing 70. In some embodiments, a plurality of circuit boards, each with heat-generating electronic components mounted thereon can be disposed in the housing 70. The circuit board 84 can be mounted in any suitable orientation within the housing 70. In the illustrated example, the circuit board 84 is disposed in a horizontal orientation within the interior space 72 whereby a plane of the circuit board 84 is substantially perpendicular to a longitudinal axis of the delivery manifold 16 and the gravity return manifold 20.

The heat-generating electronic components 86 can be mounted on the top surface of the circuit board 84, on the bottom surface of the circuit board 84, or on both the top and bottom surfaces of the circuit board 84 as illustrated (the broken lines in FIG. 3 illustrate electronic components 86 mounted on the bottom surface of the circuit board 84 and therefore not visible in the top view of FIG. 3). The heat-generating electronic components 86 can be any electronic components that generate heat and that one may wish to cool by submerging the electronic components in the cooling liquid. For example, the electronic components 86 can include one or more processors, for example a CPU and/or a GPU, one or more power supplies, one or more switches, and other electronic components.

The electronic components 86 that are to be cooled are submerged in cooling liquid within the interior space 72. The broken horizontal line 88 in FIG. 2 indicates a maximum level of the cooling liquid in the housing 70 whereby the circuit board 84 and all of the electronic components 86 mounted thereon are completely submerged in the cooling liquid in direct contact therewith.

The cooling liquid is introduced into the housing 70 via a cooling liquid supply line 90 that is fluidly connected to one of the liquid delivery outlets 46 of the supply manifold 16. A valve 92 can be provided in the supply line 90 to control the incoming flow of the cooling liquid. The supply line 90 is fluidly connected to a multi-port distribution manifold 94 of the electronic device 14. In the illustrated example, the distribution manifold 94 is disposed within the housing 70 and is submerged in the cooling liquid. However, in some embodiments the distribution manifold 94 can be located outside the housing 70 or located within the housing 70 but above the maximum cooling liquid level 50. Alternative to, or in addition to, the distribution manifold 94, the cooling liquid can be input directly into the housing 70 via an input line 96 shown in broken line in FIG. 2.

The distribution manifold 94 includes a plurality of distribution outlet ports 98. One or more of the outlets ports 98 can be closed, for example by a valve or by a removable cap or plug, to prevent the flow of cooling liquid therefrom and into the bulk cooling liquid in the housing 70. In addition, one or more of the outlet ports 98 can be open so that cooling liquid is input directly into the bulk cooling liquid in the housing 70.

In other embodiments, a fluid line(s) or tube 100 can be connected to one or more of the outlet ports 98. The fluid line(s) 100 is used to direct the return cooling liquid directly onto a respective one of the heat generating electronic components 86 in what may be termed directed flow or directed liquid cooling where a flow of the return supply of cooling liquid is directed onto the heat generating electronic component 86 which is also submerged within the bulk cooling liquid within the housing 70. In some embodiments, a dispersion plenum housing (not shown) can be disposed over the heat generating electronic component 86 and fluidly connected to the end of the fluid line 100 to constrain the flow of the returning cooling liquid as it flows over the heat generating electronic component 86. The use of directed liquid cooling and dispersion plenum housings are disclosed in U.S. Pat. No. 7,901,06 the entire contents of which are incorporated herein by reference.

Still referring to FIGS. 2 and 3, the housing 70 further includes at least one cooling liquid return outlet 102 through which cooling liquid can exit the housing 70 and flow into the gravity return manifold 20. As depicted in FIG. 2, the outlet 102 is disposed at the maximum cooling liquid level 88. In addition, the outlet 102 establishes the level of the cooling liquid within the housing 70 and establishes a volumetric rate of flow of the cooling liquid within the housing 70 that is needed for the cooling of the heat generating electronic components 86. If the cooling liquid is not at the maximum level 88, then cooling liquid will not flow out of the outlet 102. However, once the cooling liquid reaches the maximum level 88, then the cooling liquid will flow out of the outlet 102, and the cooling fluid will be maintained at the maximum level 88. The outlet 102 can have any configuration that controls the level of the cooling liquid to maintain the maximum level 88 and allows discharge of the cooling liquid. For example, the outlet 102 can be a weir. FIG. 3 illustrates the weir or outlet 102 as extending across the entire width of the second end panel 78 of the housing 70. However, the weir or outlet 102 can extend over a portion of the width of the second end panel 78.

As used throughout this description and claims, a weir is an outlet for the cooling liquid where the cooling liquid exits the interior space via gravity without using pump pressure connected to the weir. The weir establishes the level of the dielectric cooling liquid within the interior space and establishes a volumetric rate of flow of the dielectric cooling liquid within the interior space that is needed for the cooling of the heat generating electronic components. A weir is different than, and distinct from, an outlet which during use is intended to be connected to a pump so that pump pressure causes the cooling liquid to exit through the outlet, such as the outlets 52b, 112 described in U.S. Pat. No. 7,905,106.

Figure 4:
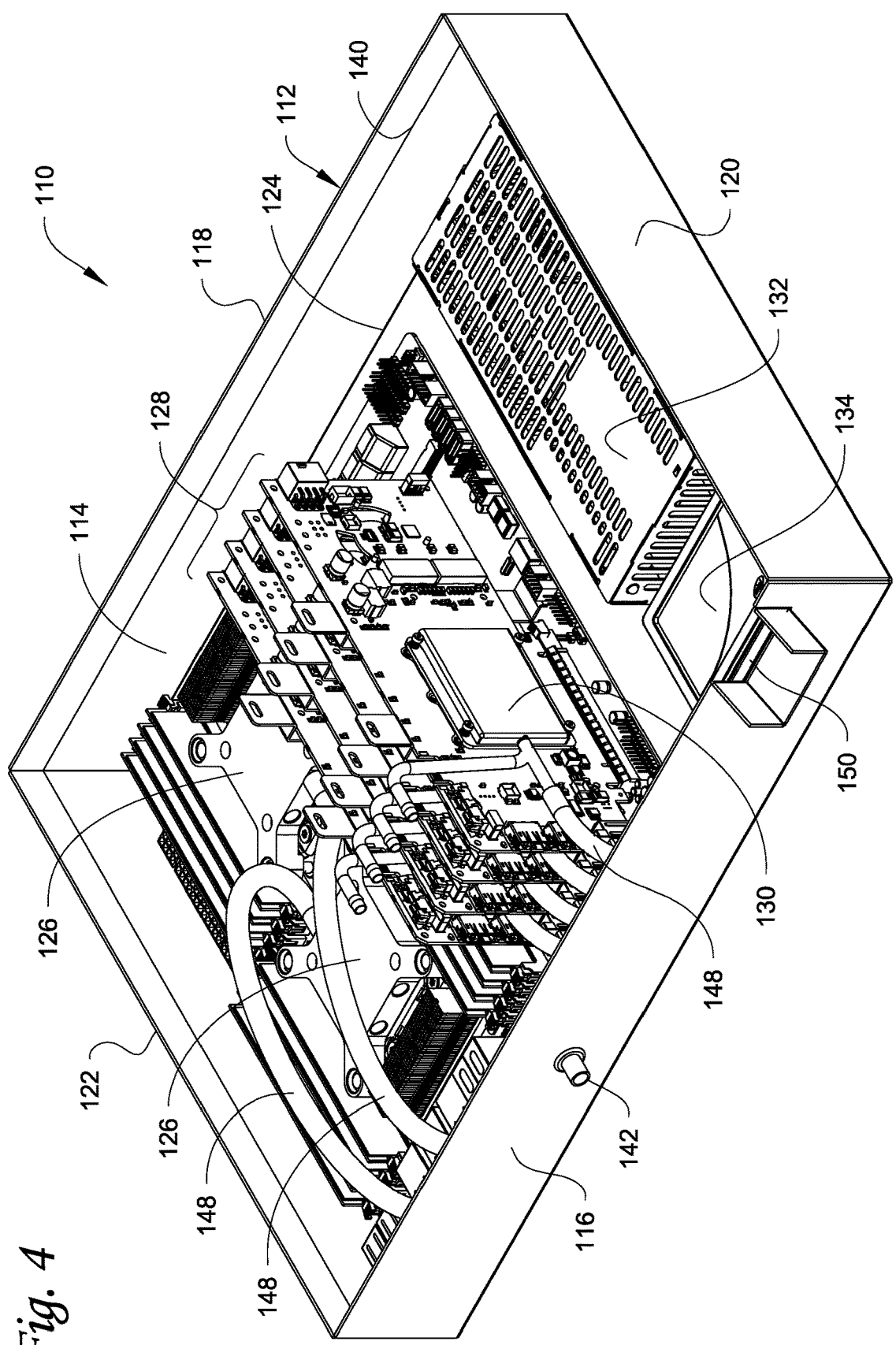
FIG. 4 is a perspective view of another embodiment of a liquid submersion cooled electronic device described herein.
Figure 5:
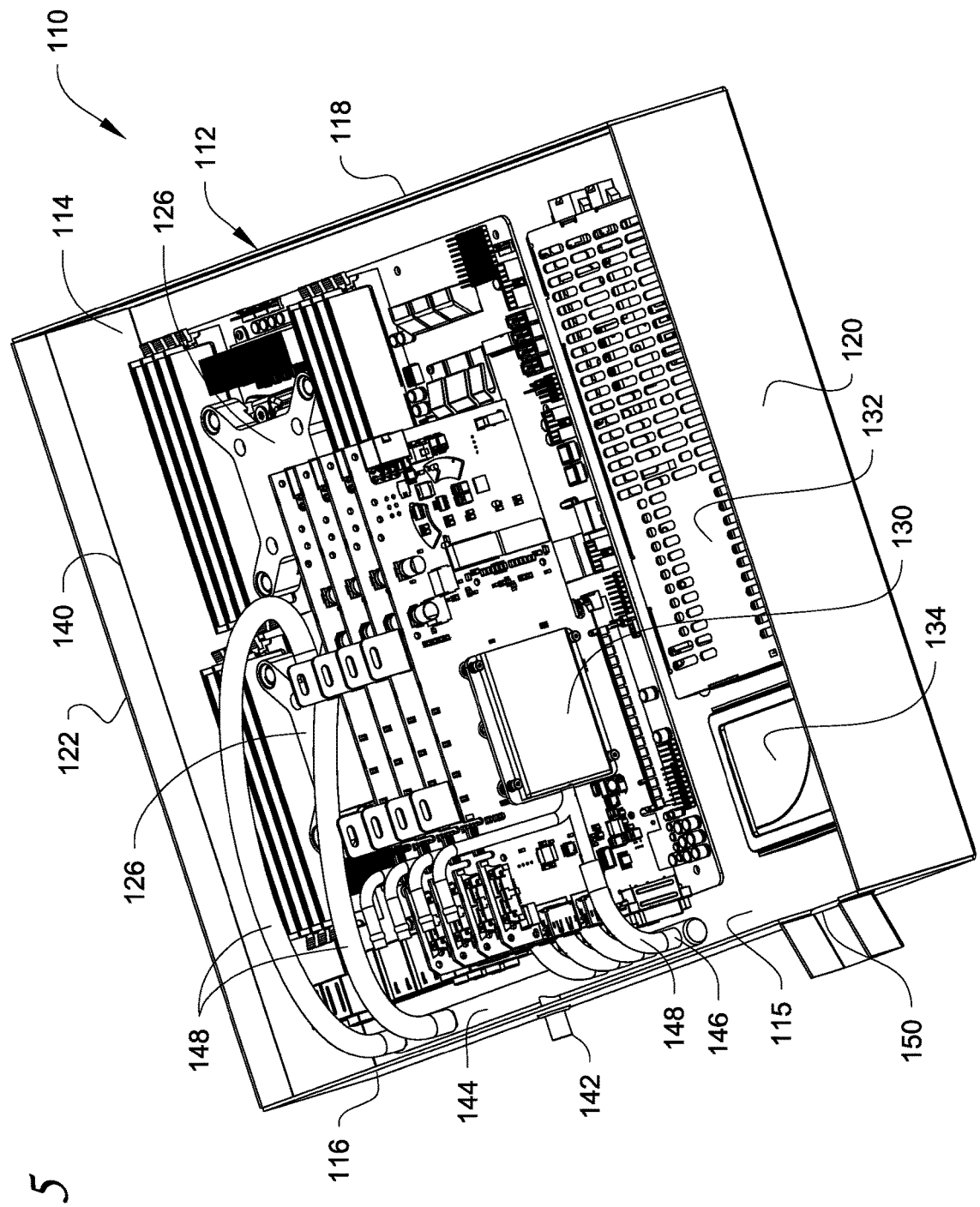
FIG. 5 is another perspective view of the electronic device of FIG. 4.

Referring to FIGS. 4 and 5, another embodiment of a liquid submersion cooled electronic device 110 that can be used in the system 10 of FIG. 1 is illustrated. The electronic device 110 includes a device housing 112 defining an interior space 114. In the illustrated example, the device housing 112 is in the form of a tray that has a completely or partially open top. The tray can be round, triangular, square, rectangular, or any other shape. The illustrated tray is rectangular and has a bottom panel 115, a first end panel 116, a second end panel 118 opposite the first end panel 116, a first side panel 120, and a second side panel 122 opposite the first side panel. The top of the tray opposite the bottom panel 115 is completely or partially open meaning that a panel or other closure does not close the top. The bottom panel 115, the end panels 116, 118 and the side panels 120, 122 form the interior space 114 in which electronic components and the cooling liquid will be contained. The tray is liquid tight to prevent unintended leakage of cooling liquid from the housing 112.

In another embodiment, a lid can be provided at the top of each housing/tray 112 (or the housing/tray 70) to partially or fully close the open top thereof The use of lids would reduce the potential for particulate and/or water condensation contamination of the cooling fluid. The lids need not be sealed/liquid tight/air tight with the remainder of the housing/tray 112 since, for example, there can be one or more openings for any wires to connect to the electronics within the housings/trays, and there may also be at least one outlet opening (described further below or described above as outlet 102) at the housing/lid interface for the cooling liquid return path to the reservoir. The lids, if used, can be mounted to be removable from the housing 112 or hinged to the housing 112 to provide for easy access to the electronic components.

At least one circuit board 124 having various heat-generating electronic components mounted thereon is disposed in the interior space 114 of the housing 112. The circuit board 124 can be mounted in any suitable orientation within the housing 112. In the illustrated example, the circuit board 124 is disposed in a horizontal orientation within the interior space 114 whereby a plane of the circuit board 124 is substantially perpendicular to a longitudinal axis of the delivery manifold 16 and the gravity return manifold 20 of the system 10.

A pair of CPU's (hidden by dispersion plenum housings 126 discussed further below) are mounted on the circuit board 124. In addition, a plurality of graphics cards 128 each including a GPU (hidden by dispersion plenum housings 130 discussed further below, only one of which is visible) are mounted on the circuit board 124. In addition, a power supply 132 and a data and/or program storage device 134 are disposed within the housing 112 but not mounted on the circuit board 124

The electronic components of the electronic device 110 that are to be cooled are submerged in cooling liquid within the interior space 114. The line 140 in FIG. 4 indicates a maximum level of the cooling liquid in the housing 112 whereby the circuit board 124, the CPUs and the plenum housings 126, the GPUs and the plenum housings 130, other electronic components on the circuit board 124 and the graphics cards 128 are completely submerged in the cooling liquid in direct contact therewith. In addition, the power supply 132 and the storage device 134 are also completely submerged in the cooling liquid in direct contact therewith.

The cooling liquid is introduced into the housing 112 via a cooling liquid supply inlet 142 that is fluidly connected to one of the liquid delivery outlets 46 of the supply manifold 16 of FIG. 1 via a cooling liquid supply line similar to the supply line 90. A valve, similar to the valve 92 in FIG. 2, can be provided to control the incoming flow of the cooling liquid through inlet 142. In this embodiment, the inlet 142 is formed in the first end panel 116. The inlet 142 is fluidly connected to a multi-port distribution manifold 144 of the electronic device 110. In the illustrated example, the distribution manifold 144 is disposed within the housing 112 and is submerged in the cooling liquid. However, in some embodiments the distribution manifold 144 can be located outside the housing 112 or located within the housing 112 but above the maximum cooling liquid level 140. Alternative to, or in addition to, the distribution manifold 144, the cooling liquid can be input directly into the housing 112 via an input line similar to the input line 96 shown in FIG. 2.

The distribution manifold 144 includes a plurality of distribution outlet ports 146. One or more of the outlets ports 146 can be closed, for example by a valve or by a removable cap or plug, to prevent the flow of cooling liquid therefrom and into the bulk cooling liquid in the housing 112. In addition, one or more of the outlet ports 146 can be open so that cooling liquid is input directly into the bulk cooling liquid in the housing 112.

In other embodiments, a fluid line(s) or tube 148 can be connected to one or more of the outlet ports 146. The fluid line(s) 148 is used to direct the return cooling liquid directly onto a respective one of the heat generating electronic components in what may be termed directed flow or directed liquid cooling where a flow of the return supply of cooling liquid is directed onto the heat generating electronic component which is also submerged within the bulk cooling liquid within the housing 112. In the example illustrated in FIGS. 4 and 5, one of the fluid lines 148 extends from a respective one of the ports 146 to the dispersion plenum housings 126 over the CPUs and to the dispersion plenum housings 130 over the GPUs on the graphics cards 128. The dispersion plenum housings 126, 130 constrain the flow of the returning cooling liquid as it flows over the submerged CPUs and GPUs, thereby maximizing the cooling of the CPUs and GPUs. The use of directed liquid cooling and dispersion plenum housings is disclosed in U.S. Pat. No. 7,901,06 the entire contents of which are incorporated herein by reference.

Still referring to FIGS. 4 and 5, the housing 112 further includes at least one cooling liquid return outlet 150 through which cooling liquid can exit the housing 112 and flow into the gravity return manifold 20 of FIG. 1. The outlet 150 is disposed at the maximum cooling liquid level 140. If the cooling liquid is not at the maximum level 140, then cooling liquid will not flow out of the outlet 150. However, once the cooling liquid reaches the maximum level 140, then the cooling liquid will flow out of the outlet 150, and the cooling fluid will be maintained at the maximum level 140. The outlet 150 can have any configuration that controls the level of the cooling liquid to maintain the maximum level 140 and that allows discharge of the cooling liquid. For example, the outlet 150 can be a weir. FIGS. 4 and 5 illustrate the weir or outlet 150 as being formed in the first end panel 116 and extending across only a portion of the end panel 116. However, the weir or outlet 150 can be formed in other ones of the panels 118, 120, 122 and can extend over the entire length of the panel it is formed in.

Figure 6:
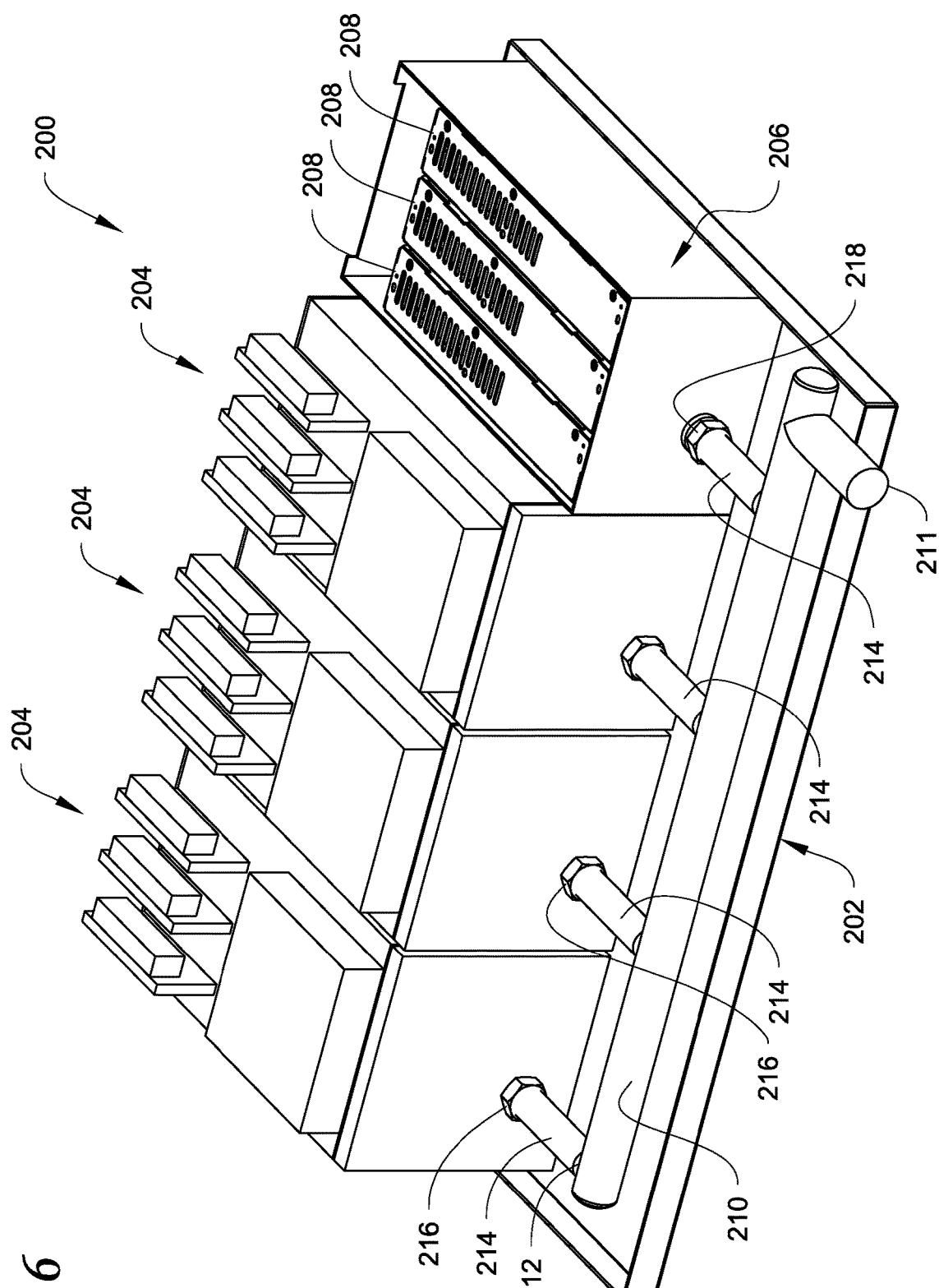
FIG. 6 is a perspective view of still another embodiment of a liquid submersion cooled electronic device described herein.
Figure 7:
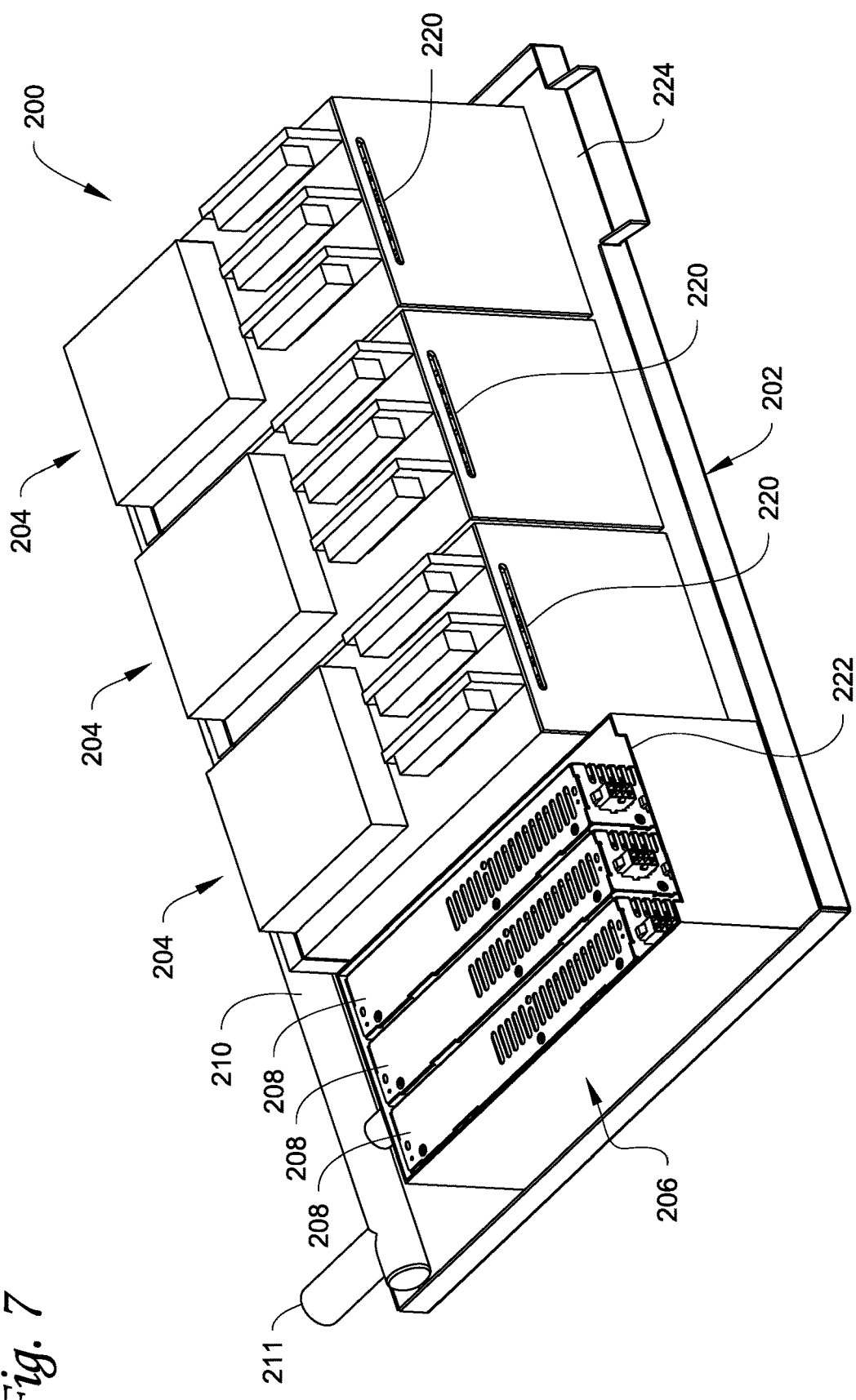
FIG. 7 is another perspective view of the electronic device of FIG. 6.

Referring to FIGS. 6 and 7, another embodiment of an electronic device 200 that can be used in the system 10 of FIG. 1 is illustrated. In this embodiment, the device 200 includes a device housing 202 or tray that has a completely or partially open top. The tray can be round, triangular, square, rectangular, or any other shape. In this embodiment, the housing 202 or tray is much shallower (i.e. has less vertical depth) than the housings 70, 112.

A plurality of electronic devices 204 are mounted in the tray. In the illustrated example, three of the devices 204 are provided, although a smaller or larger number of systems can be used. In one non-limiting embodiment, each one of the devices 204 is an Antminer® system which is bitcoin mining ASIC hardware. Each Antminer® system can include printed circuit boards, for example 3 circuit boards, populated with a large number of ASICs which may have passive finned heat sinks bonded to them for additional heat dissipation. A power supply container 206 that contains a power supply 208 for each one of the electronic devices 204 is also mounted in the tray.

A multi-port distribution manifold 210 is provided that includes a plurality of distribution outlet ports 212. The manifold 210 is fluidly connected to the delivery manifold 16 of FIG. 1 via an inlet 211. Fluid lines 214 extend between the outlet ports 212 and inlet ports 216 of the electronic devices 204 and an inlet port 218 on the container 206. The fluid lines 214 direct the return cooling liquid from the distribution manifold 210 into the interiors of the electronic devices 204 for submersion cooling of the electronics within the devices 204 and into the container 206 for submersion cooling of the power supplies 208. The flow of the cooling liquid inside the devices 204 is more of a managed bulk flow that distributes the cooling liquid between partitions formed by the circuit boards, submerging the ASICs and other electronic components on the circuit boards in the cooling liquid.

Referring to FIG. 7, fluid exits each one of the devices 204 via an exit opening or weir 220 formed in the side of the device 204 opposite the inlet port 216. The devices 204 are otherwise generally liquid-tight so that the devices 204 fill with the cooling liquid up to the level of the exit openings 220. Once the exit openings 220 are reached, the cooling liquid spills out through the exit openings 220 and into the tray. The container 206 can be open at the top thereof (as illustrated) or the top can be closed. An exit opening 222 is formed in a side of the container 206 opposite the inlet port 218. The container 206 is otherwise generally liquid-tight so that the container 206 fills with the cooling liquid up to the level of the exit opening 222. Once the exit opening 222 is reached, the cooling liquid spills out through the exit opening 222 and into the tray.

Still referring to FIGS. 6 and 7, the housing 202 or tray further includes at least one cooling liquid return outlet 224 (shown in FIG. 7) through which cooling liquid can exit the housing 202 and flow into the gravity return manifold 20 of FIG. 1. In this embodiment, the majority of the cooling liquid is disposed within the electronic devices 204 and the container 206, and the tray, which is shallow, holds a relatively minimal amount of the cooling liquid compared to the trays in FIGS. 1-3 and 4-5. The outlet 224 can have any configuration that allow the cooling liquid to flow out of the tray and into the gravity return manifold. For example, the outlet 224 can be a weir. FIG. 7 illustrates the weir or outlet 224 as being fanned in a side of the tray opposite the distribution manifold 210 and extending across only a portion of the tray. However, the weir or outlet 224 can be formed in other sides of the tray and can extend over the entire length of the side it is formed in.

Referring to FIGS. 8-12, another embodiment of a liquid submersion cooled electronic system 300 will now be described. In this embodiment, elements that are similar in construction and operation to elements in the system 10 are referenced using similar reference numbers. This embodiment includes a "positive constant-pressure" cooling liquid delivery system where the operation of the pump 22 (FIG. 11) is governed to satisfy a min/max set of pressure limits.

For example, in the system 300, a pressure tank 302 is connected to the top of the delivery manifold 16. A pressure sensor 304 is located at an appropriate location in the system 300, for example on the delivery manifold 16 at the approximate level of the $3^{rd}$ electronic device 14 down on the manifold 16. Pressure readings from the sensor 304 are used to govern the operation of the pump 22 to satisfy a min/max set of pressure limits The pressure tank 302 serves as an accumulator/pressure tank to provide a buffer volume of cooling liquid to ensure that large fluctuations in flow and large variations in pressure are not experienced by the electronic devices 14 as a result of time delays that might result as the pump 22 reacts to sensor control commands and then has to move the cooling liquid through the heat exchanger 24, hoses, manifolds, etc. to satisfy the desired pressure conditions at the sensor 304 and all ports served by the cooling liquid supply.

Still referring to FIGS. 8-12, it is desirable that return flow of the cooling liquid from the outlets 102 of the housings/trays 70 not adversely impact the return flow path of any other housing/tray 70 nor feed returning cooling liquid into any housing/tray 70 that is at a lower elevation in the system 300. In addition, it is desirable that the returning cooling liquid being returned to the reservoir 18 have minimal air entrainment in order to minimize the potential for cavitation events in the pump 22. Further, it is desirable to avoid long vertical drops of the returning cooling liquid in the gravity return manifold 20 since long vertical drops would generate unwelcome acoustic noise and result in significant air entrainment as the returning cooling liquid impacts with the surface of the bulk volume of cooling liquid in the reservoir 18.

Figure 8:
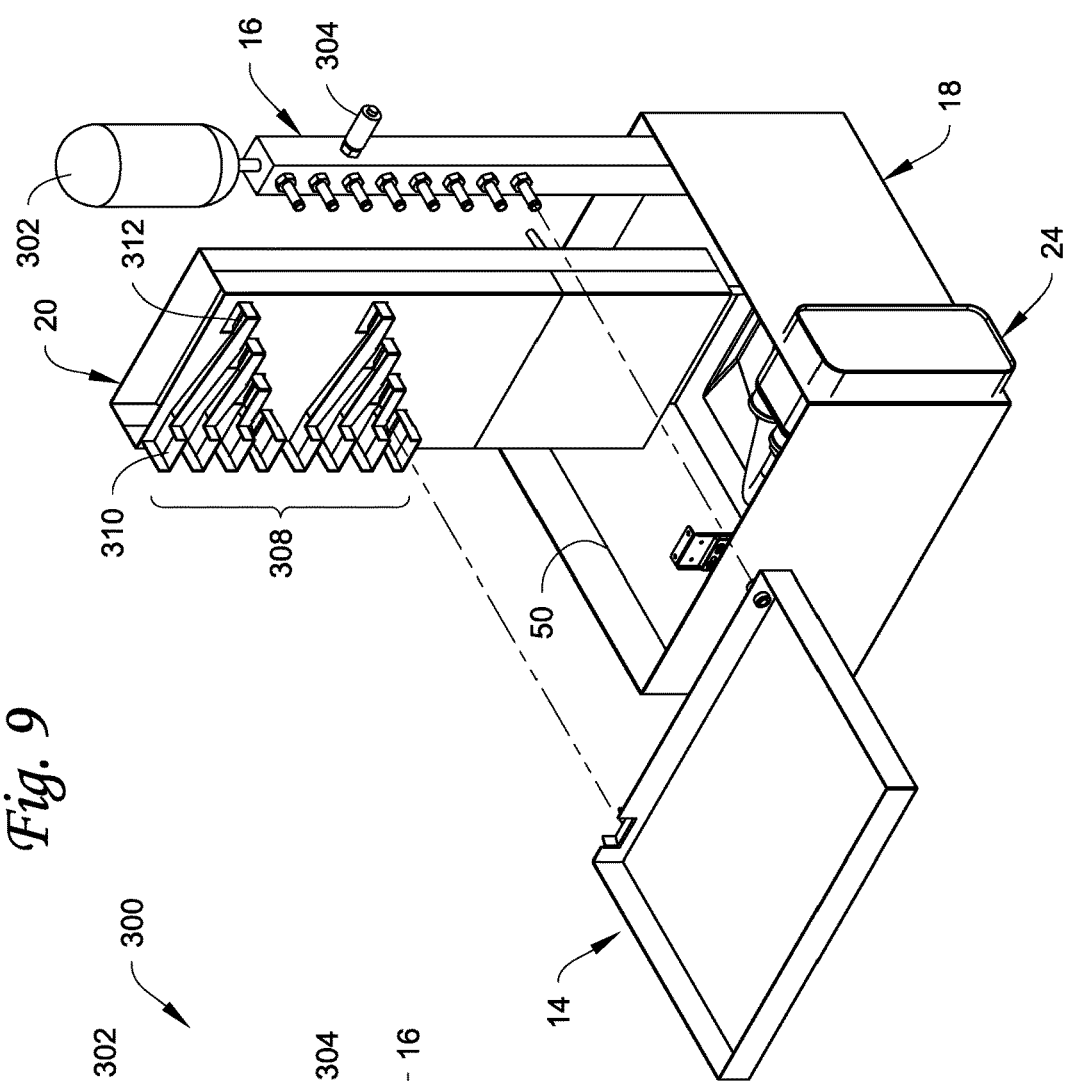
FIG. 8 is a perspective view of another embodiment of a liquid submersion cooled electronic system described herein.
Figure 9:
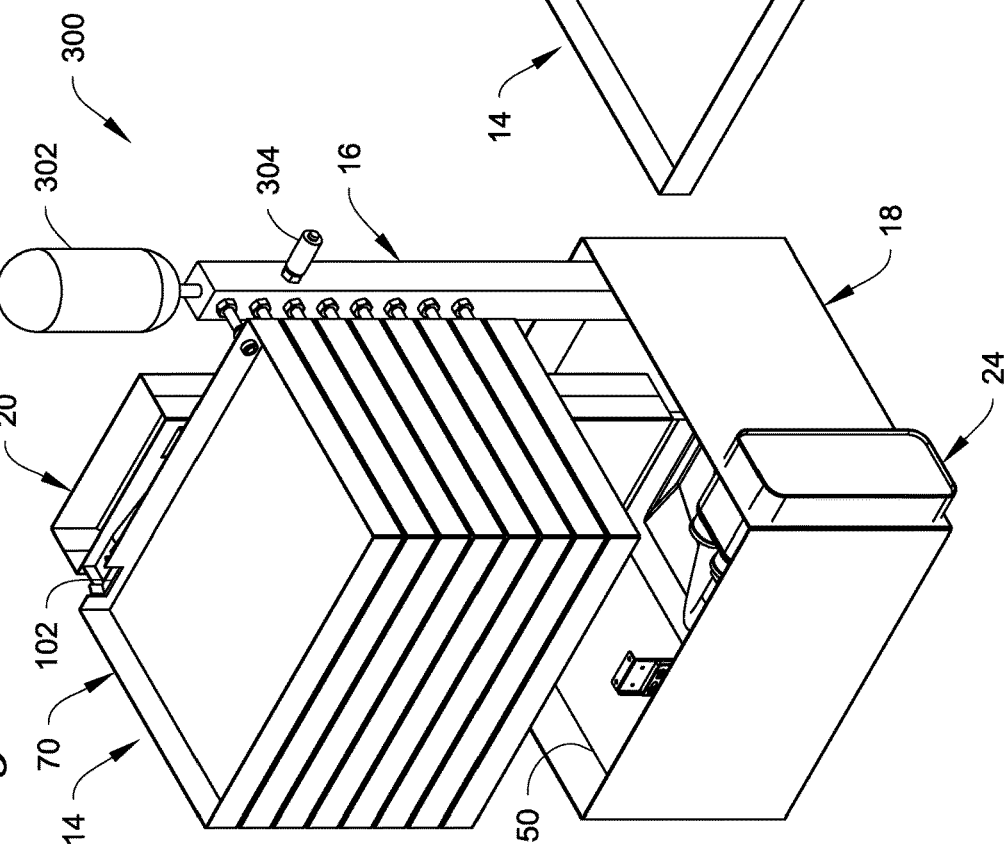
FIG. 9 is a perspective view of the system of FIG. 8 with the electronic devices removed to illustrate an example of how cooling liquid exiting the electronic devices can be introduced into the gravity return manifold.
Figure 11:
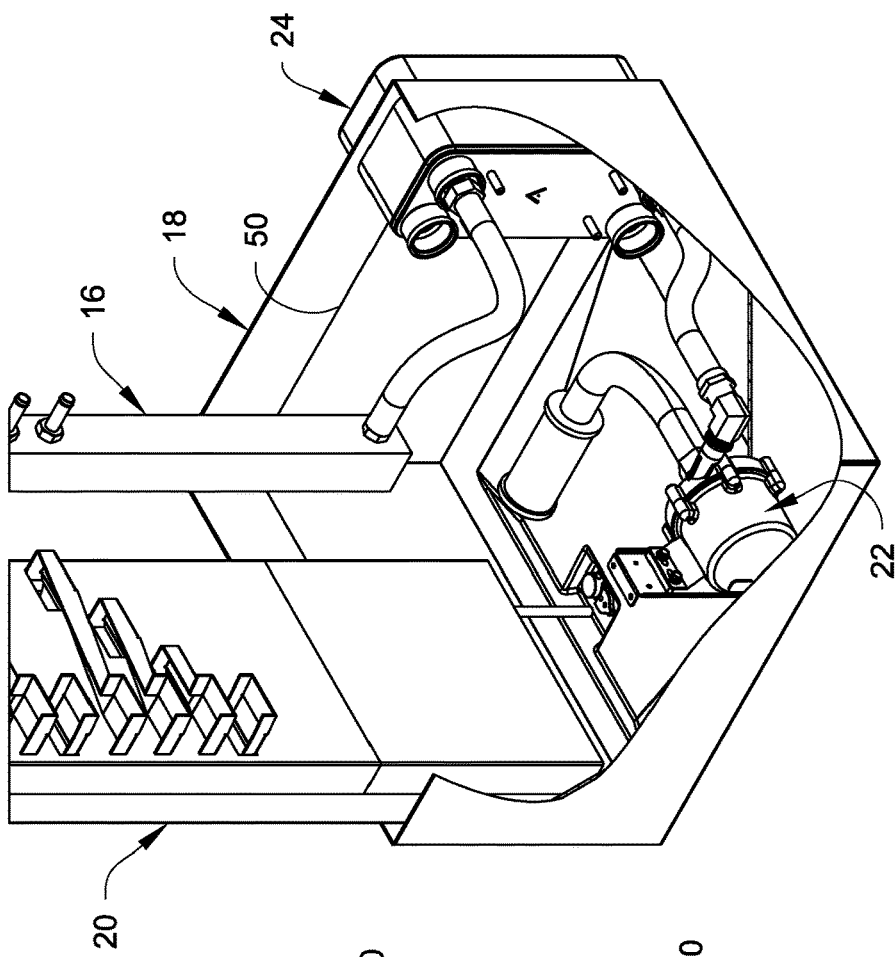
FIG. 11 illustrates the reservoir used in the system of FIG. 8.
Figure 10:
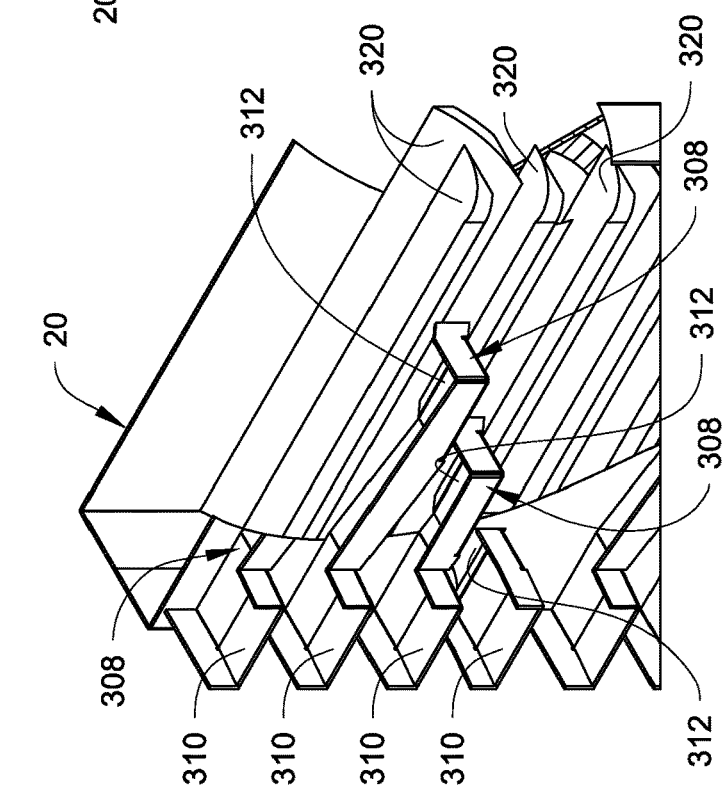
FIG. 10 is a detailed view of a portion of FIG. 9.

One way to achieve these goals is illustrated in FIGS. 9-12. The outlets 102 from the electronic devices 14 extend a portion of the width of the electronic device 14 as illustrated in FIG. 8 (similar to the outlets 150, 224 in FIGS. 4 and 7). As best seen in FIGS. 9 and 10, the outside surface of the return manifold 20 includes a series of cooling liquid outflow ramps 308, one outflow ramp 308 for each electronic device 14. The outflow ramps 308 have an inlet end 310 that receives cooling liquid from the respective outlet 102 and an outlet end 312 leading into the interior of the return manifold 20. Between the inlet end 310 and the outlet end 312, the ramps 308 slope gradually downwardly so that the cooling liquid flows from the inlet end 310 to the outlet end 312 where the cooling liquid then flows into the interior of the return manifold 20. In the illustrated example, the outflow ramps 308 of the first group of four electronic devices 14 vary in length, with the second group of four electronic devices 14 having a similar variation as the first group of four. The inlet ends 310 are vertically located one-above the other, but the outlet ends 312 are laterally staggered from one another in each group of four electronic devices 14 so that the returning cooling liquid discharges into the return manifold 20 at staggered locations.

In addition, the interior space of the return manifold 20 is configured to prevent long free-falls of the returning cooling liquid. For example, as best seen in FIGS. 10 and 12, a series of flow interrupters 320 are provided on the interior of the manifold 20 from about the level of the topmost electronic device 14 and extending to below the lowermost electronic device 14. The flow interrupters 320 are illustrated as a series of walls projecting from the facing front and rear walls of the return manifold 20, with the walls projecting from the front wall alternating with the walls projecting from the rear wall. Cooling liquid entering the return manifold 20 through one of the outlet ends 312 flows onto the one of the flow interrupters 320 projecting from the front wall, which is then directed to flow onto the next flow interrupter 320 projecting from the rear wall, which then directs the liquid to flow onto the next flow interrupter 320 projecting from the front wall, etc. This cascading of the cooling liquid down the alternating flow interrupters 320 within the return manifold 20 ensures that the return flow from any one of the outlets 102 does not adversely impact the return flow path of any other housing/tray 70 nor feed returning cooling liquid into any housing/tray 70 that is at a lower elevation in the system 300, helps to avoid long vertical drops of the returning cooling liquid, and minimizes air entrainment by minimizing splashing of the cooling liquid.

FIG. 13 (together with FIG. 12) illustrate another example of a liquid submersion cooling system 400. The system 400 can be similar in construction to the system 300 or to the system 10. In this embodiment, elements that are similar in construction and operation to elements in the system 300 or the system 10 are referenced using similar reference numbers. In this embodiment, the reservoir 18 includes a contoured floor that controls where water condensate would accumulate if present. In particular, the cooling liquid is typically an oil that has a specific gravity that is less than water. The cooling liquid and the water are non-miscible, so the water will settle out at the bottom of the reservoir 18 in the lowest location so long as the slope of the floor of the reservoir 18 guides the water droplets to that lowest point. The cooling liquid will simply stratify above the condensed water in the reservoir 18.

As shown in FIGS. 12 and 13, the contoured floor of the reservoir 18 is formed with a well or recess 402 that is intended to collect water condensate. The floor of the reservoir 18 is contoured toward the well 402 so that any water condensate accumulates in the well 402. A water sensor 404 can be located in the well 402 for detecting accumulated water. A mechanism for draining water from the well 402 is also provided. For example, the mechanism can comprise a siphon tube 406 that can extend from the well 402 up and out of the reservoir 18 where a siphon pump (not shown) could be attached to draw the water out of the system. Alternatively, a drain port from the bottom of the well 402 could be provided with a manually or automatically operated shut off valve to drain water from the well 402.

In the system 400, the inlet of the pump 22 should be placed at a suitable location and elevation relative to the well 402 to avoid sucking water into the pump 22 and forcing the water into the electronic devices 14 where the water could contact the electronics. In addition, the inlet for the pump should be relatively low in the reservoir 18 from an elevation point of view to minimize bubbles being drawn into the pump 22 but not so low that pump 22 could be drawing water from the lowest portion of the reservoir 18 into the flow of cooling liquid. FIG. 13 illustrates one example relative location between the inlet 408 of the pump 22 and the well 402. In this embodiment, the filter 54 is located on the inlet 408 to filter the cooling liquid before it enters the pump 22 rather than being located on the pump outlet.

In addition to the reservoir 18 having the well 402 to collect water, each of the housings/trays 70, 112 that house the electronics can also be configured to accumulate water condensate in a similar manner. For example, like the reservoir 18, the floor of the housings/trays 70, 112 can be contoured to direct water condensate into a well formed in the floor of the housings/trays 70, 112. A mechanism for draining accumulated water from the wells in the housings/trays 70, 112 can also be provided.

FIGS. 14-19 illustrate another embodiment of a liquid submersion cooled electronic system 450 and liquid submersion cooled electronic devices 452 within the system 450. In the system 450, the devices 452 are supported on a rack 454 in an array composed of a plurality of vertically spaced rows 456 of the devices 452. Each row 456 is illustrated as including a plurality of the devices 452. However, each row 456 can include a single one of the devices 452. In addition, vertical rows are not required, and a plurality of the devices 452 can be disposed in a single horizontal array.

The system 450 can include a vertical supply manifold 460, a horizontal supply manifold 462 for each row 456, a horizontal return manifold or gutter 464 for each row 456, a vertical gravity return manifold or gutter 466 (best seen in FIG. 15), a reservoir 468, a pump 470 and a heat exchanger 472. Power to each electronic device 452 can be delivered by a power distribution unit 474 associated with each row 456.

Figure 14:
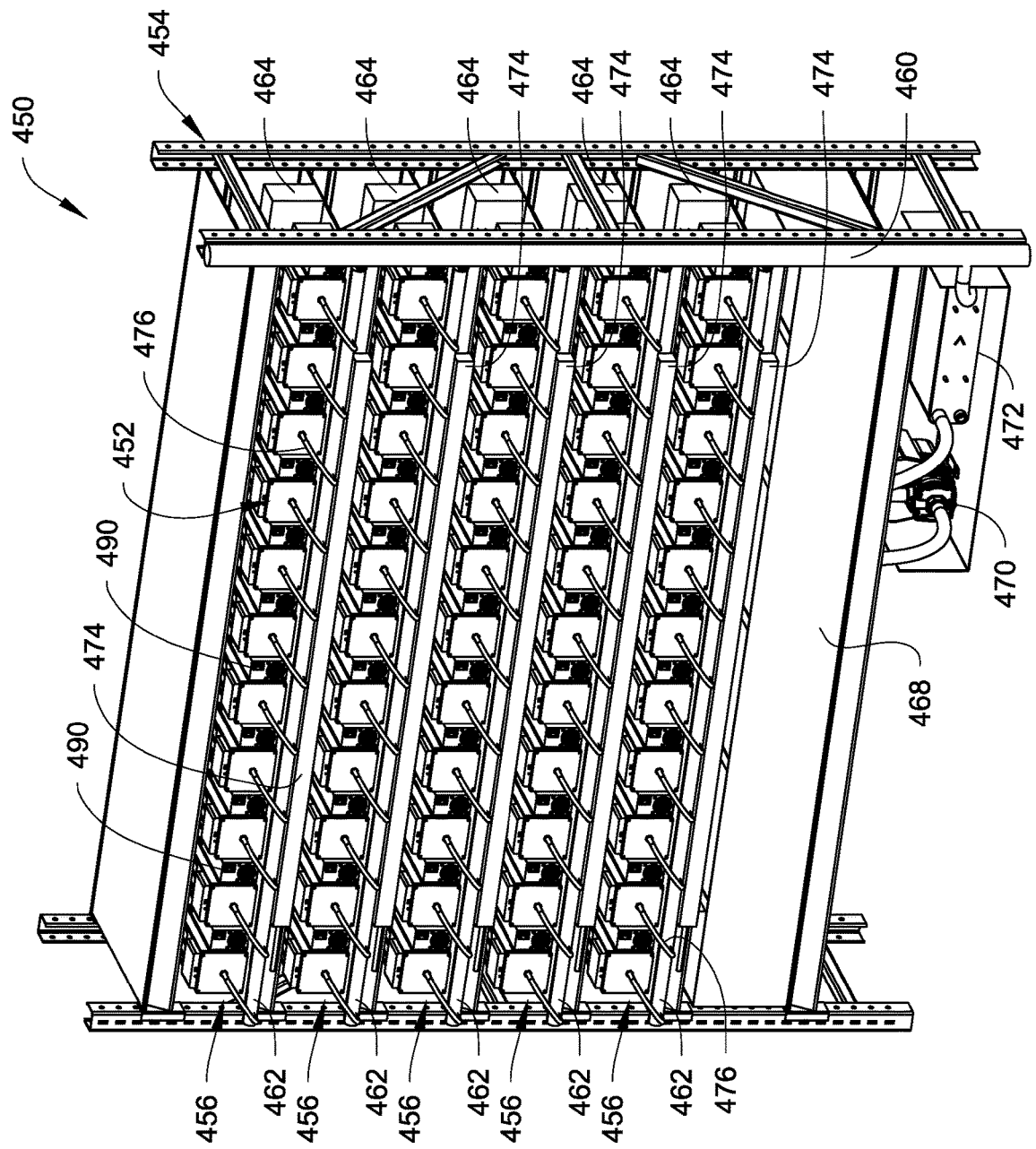
FIG. 14 is a front perspective view of another example of a liquid submersion cooled electronic system described herein.
Figure 15:
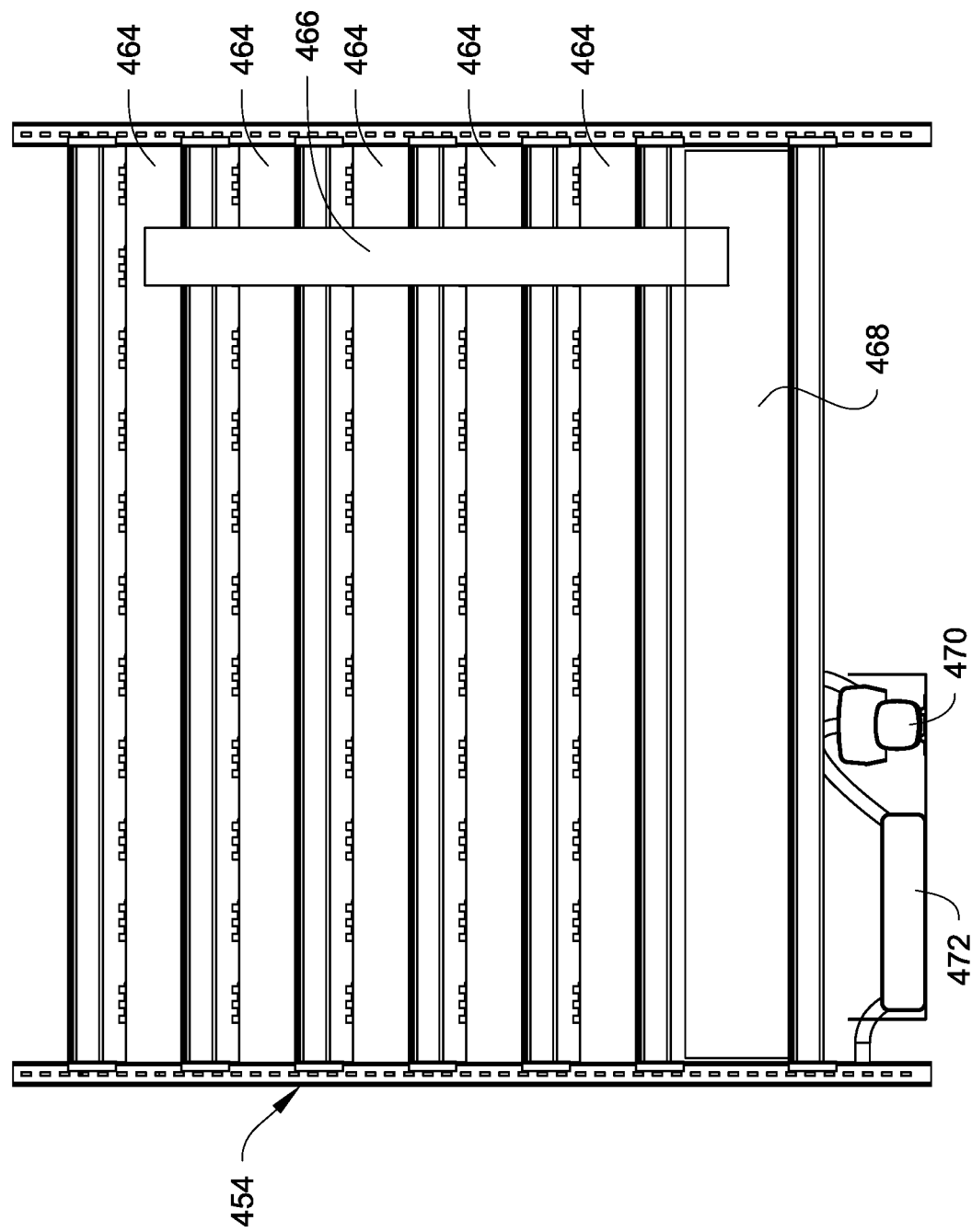
FIG. 15 is a rear view of the system in FIG. 14.
Figure 16:
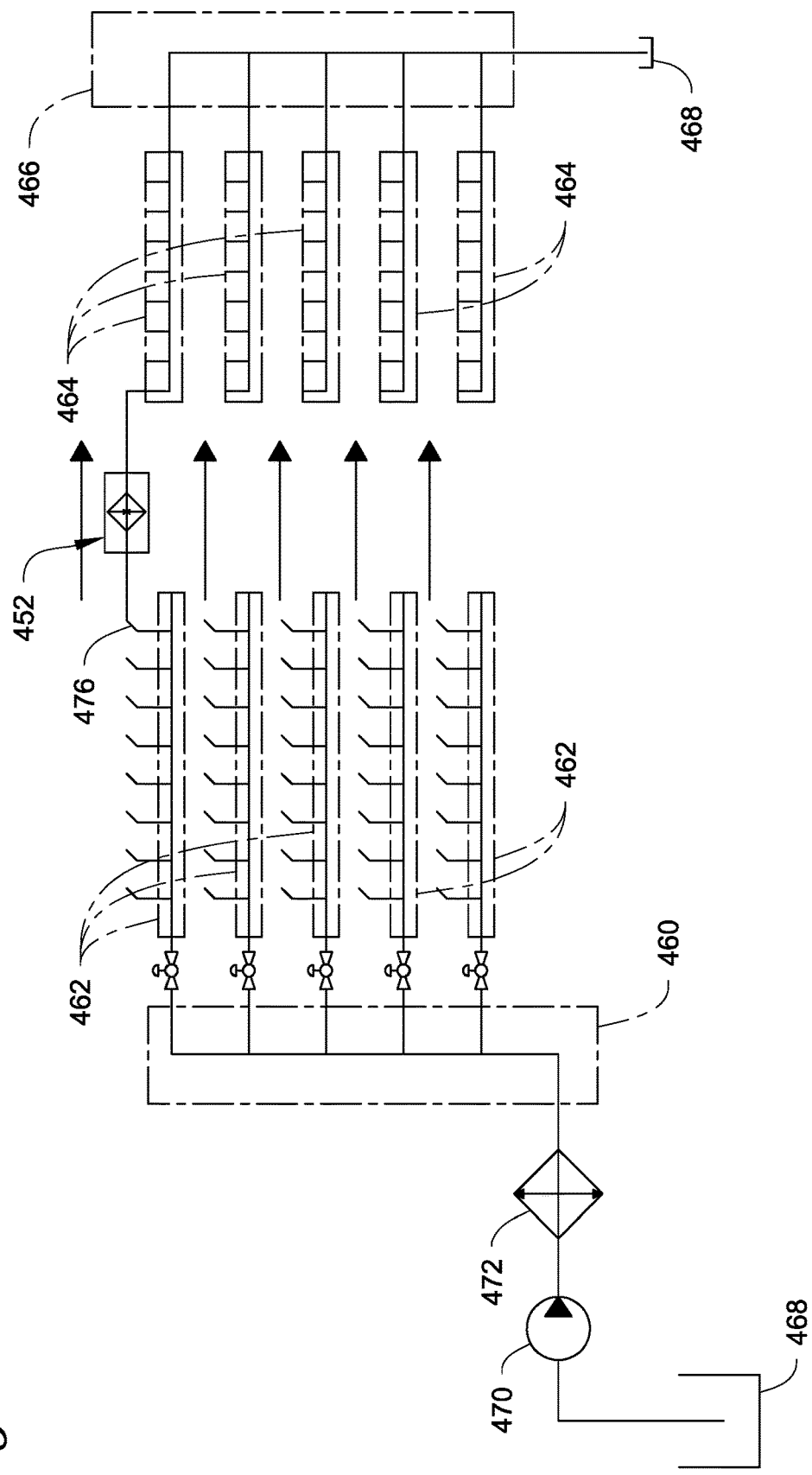
FIG. 16 is a schematic depiction of the system in FIGS. 14 and 15.

Referring to FIGS. 14-16, the supply manifold 460 supplies cooled returning cooling liquid to each of the rows 456. As seen in FIG. 14, the supply manifold 460 extends upwardly along, and is fixed to, the frame 454. Each of the supply manifolds 462 is fluidly connected to the supply manifold 460 to distribute the cooled returning cooling liquid to each of the electronic devices 452. Cooling liquid exiting each of the electronic devices 452 is discharged into the return manifold 464 at each row 456, and each return manifold 464 is fluidly connected to the gravity return manifold 466. The gravity return manifold 466 is fluidly connected to the reservoir 468 which collects the returning cooling liquid which is returned by gravity after cooling the heat generating electronics in the devices 452. An inlet of the pump 470 is connected to the reservoir 468 to pump cooling liquid from the reservoir to the heat exchanger 472 which cools the cooling liquid in any suitable manner including, but not limited to, liquid-to-liquid or liquid-air described above. The now cooled cooling liquid is then output from the heat exchanger 472 into the manifold 460 for distribution to each row 456.

Figure 18:
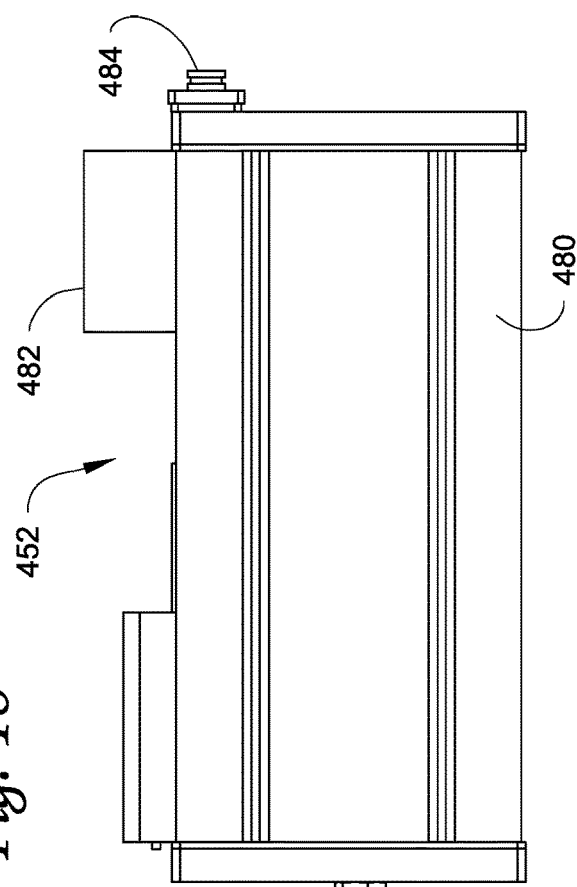
FIG. 18 is a side view of the electronic device in FIG. 17.
Figure 17:
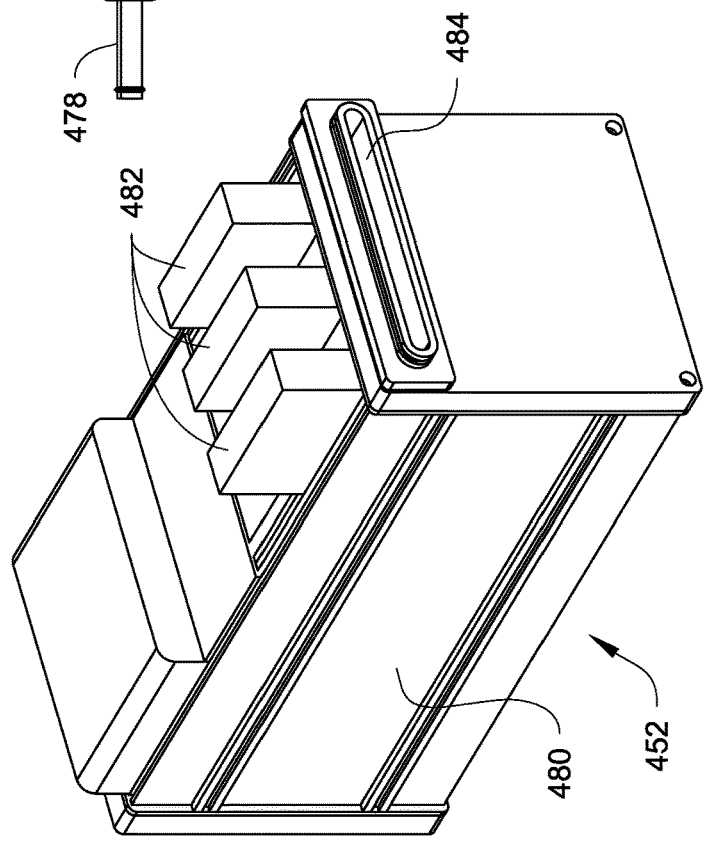
FIG. 17 is a perspective view of one of the liquid submersion cooled electronic devices of the system in FIGS. 14-16.

Referring to FIGS. 14, 17 and 18, each electronic device 452 is fluidly connected to its respective supply manifold 462 via a supply line or supply tube 476 extending from the manifold 462 to a cooling liquid inlet 478 of the device 452. Each of the devices 452 can be similar in construction to the electronic devices 204. For example, each one of the devices 452 includes a housing 480 defining an interior space with heat generating electronics disposed therein and submerged within the cooling liquid. In one non-limiting embodiment, each one of the devices 452 is configured as an Antminer® system which is bitcoin mining ASIC hardware. Each Antminer® system can include printed circuit boards, for example 3 circuit boards, populated with a large number of ASICs which may have passive finned heat sinks bonded to them for additional heat dissipation. Some electronics 482 of the devices 452 can be disposed at the top of each device 452 and not submerged in the cooling liquid. Power supplies 490 for the devices 452 can be disposed next to each device 452 and the power supplies 490 can be air cooled or cooled by liquid submersion.

The inlet 478 is disposed in a first or front side of the housing 480 to input cooling liquid into the interior space of the housing 480. An exit opening or weir 484 is formed in a second or rear side of the housing 480 opposite the side with the inlet 478. Cooling fluid exits each one of the devices 452 via the exit opening or weir 484 formed in the side of the device 204 opposite the inlet port 216. As best seen in FIG. 19, the exit openings 484 are connected to the return manifolds 464 so that the exiting cooling liquid is collected by the return manifolds 464, which in turn are fluidly connected to the gravity return manifold 466 to return the cooling liquid to the reservoir 468. The top of the housing 480 is open (i.e. there is no lid that seals the housing 480). The housings 480 are otherwise generally liquid-tight so that the devices 452 fill with the cooling liquid up to the level of the exit openings 484.

Figure 20:
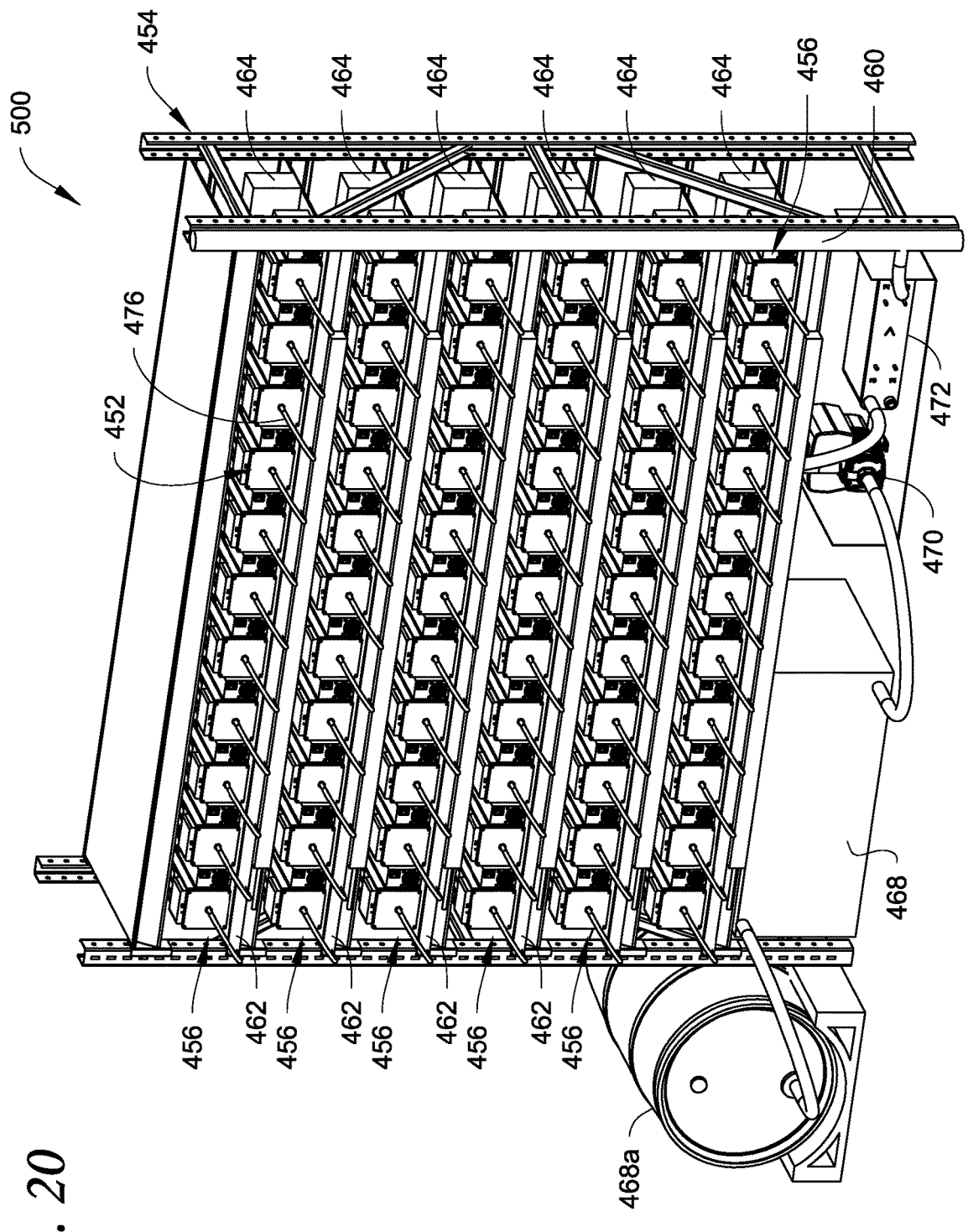
FIG. 20 is a front perspective view of still another example of a liquid submersion cooled electronic system described herein.

FIG. 20 illustrate another embodiment of a liquid submersion cooled electronic system 500 that is similar to the electronic system 450, and elements in the system 500 that are similar to the system 450 are referenced using the same reference numerals. The system 500 uses a smaller reservoir 468 compared to the reservoir 468 used in the system 450 with the smaller reservoir 468 mounted beneath the rack 454. In addition, an auxiliary reservoir 468a is provided that is fluidly connected to the reservoir 468. The auxiliary reservoir provides additional capacity for holding the cooling liquid when filling and draining the devices 452 in the entire rack 454. The configuration of the system 500 allows room for an additional row 456 of the devices 452 on the rack 454 compared to the system 450 in FIG. 14.

Figure 21:
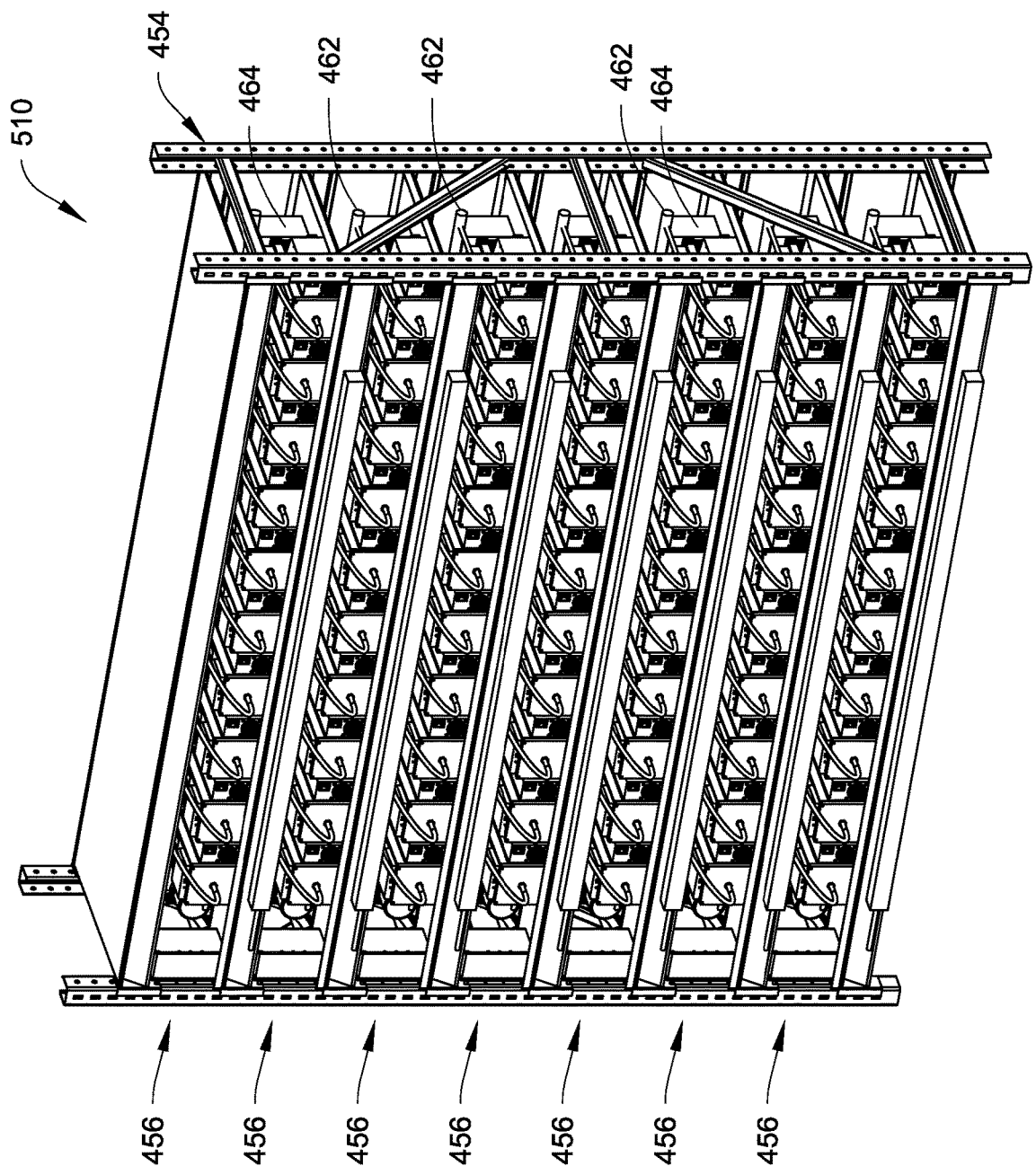
FIG. 21 is a front perspective view of still another example of a liquid submersion cooled electronic system described herein.
Figure 22:
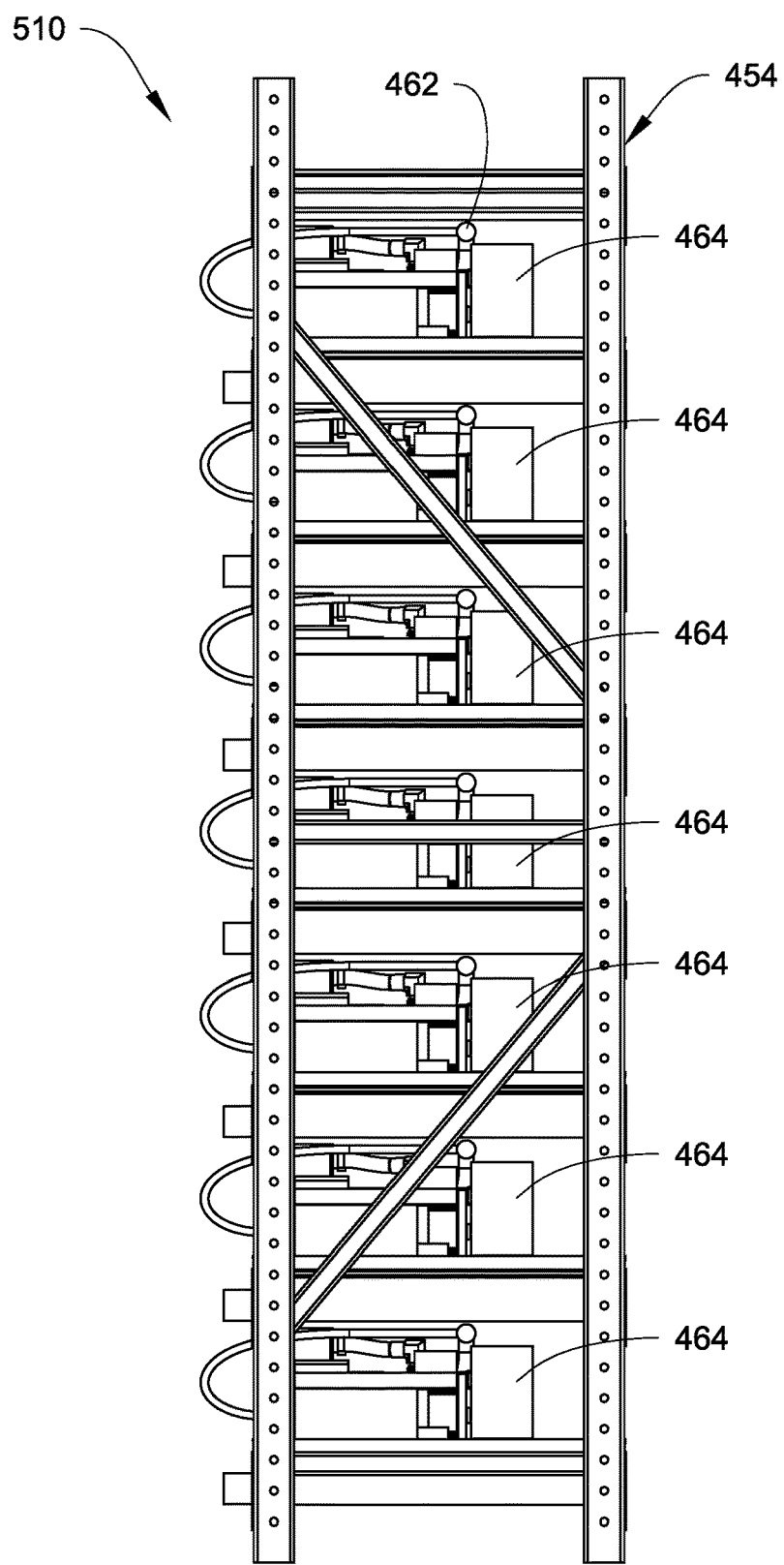
FIG. 22 is a side view of the system in FIG. 21.
Figure 23:
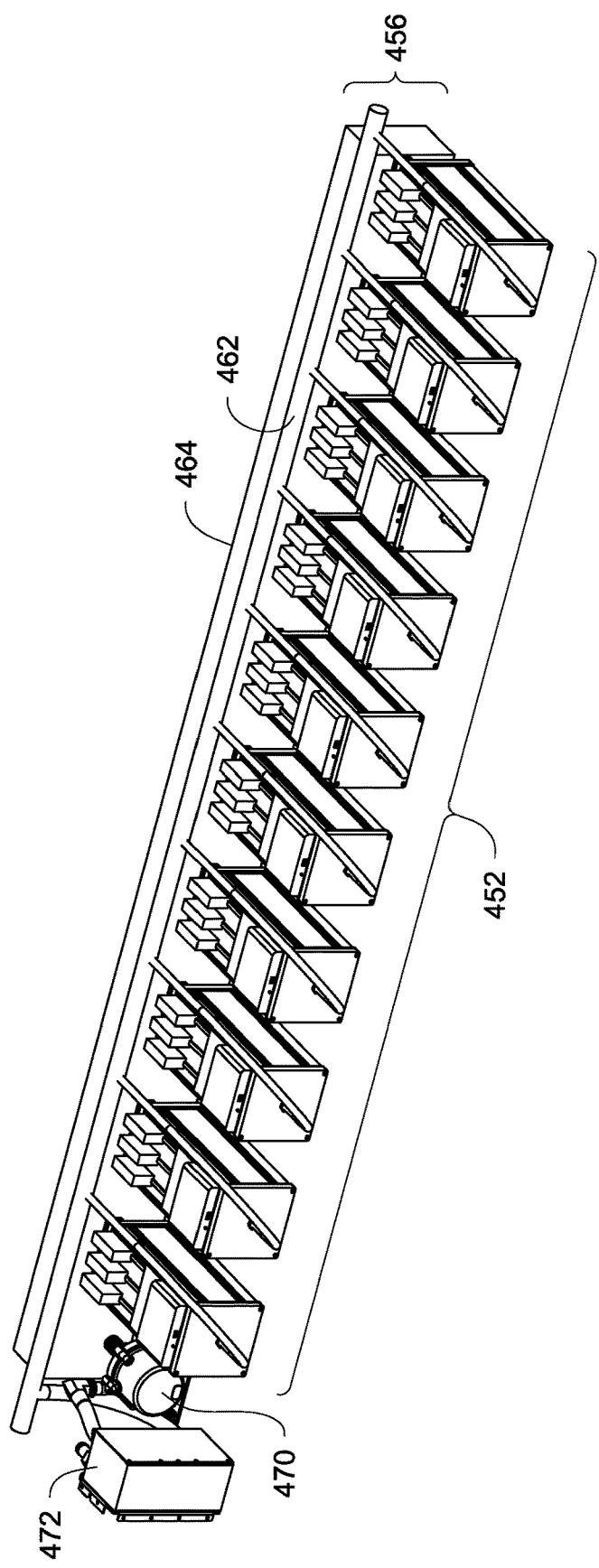
FIG. 23 illustrates the components on a single shelf of the system in FIGS. 21 and 22.
Figure 24:
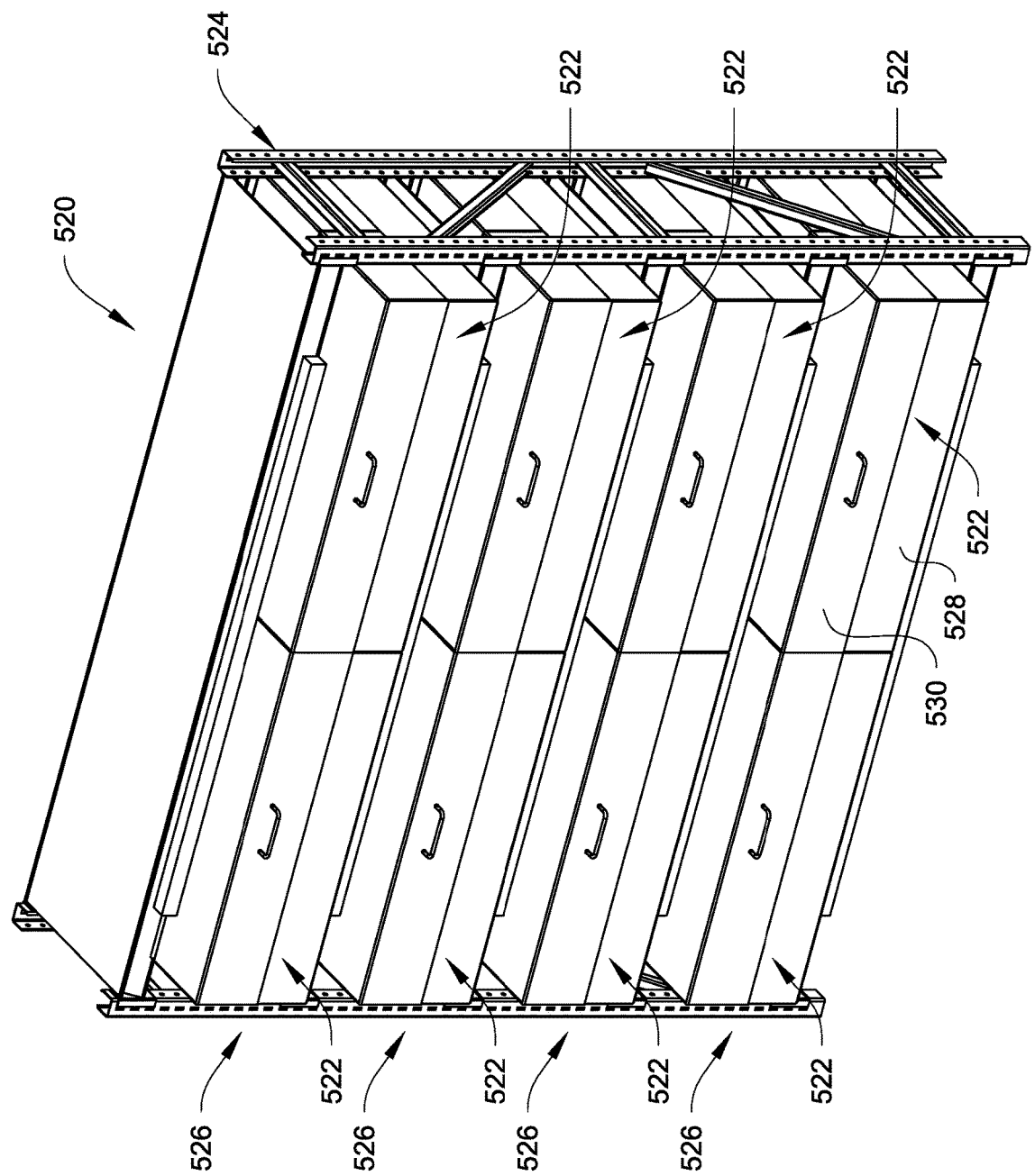
FIG. 24 is a front perspective view of still another example of a liquid submersion cooled electronic system described herein.

FIGS. 21-23 illustrate another embodiment of a liquid submersion cooled electronic system 510 that is similar to the electronic systems 450 and 500, and elements in the system 510 that are similar to the systems 450 and 500 are referenced using the same reference numerals. In the system 510, each of the rows 456 includes its own pump 470 and heat exchanger 472. Referring to FIG. 23, each row 456 includes the supply manifold 462 and the return manifold 464. The supply manifold 462 supplies the cooling liquid to each one of the devices 452 in that row, and after cooling the electronics, the cooling liquid exits each device through the exit opening 484 and into the return manifold 464 of the row. The inlet of the pump 470 is connected to the return manifold 464 to pump the returning cooling liquid from the manifold 464, through the heat exchanger 472, and into the supply manifold 462. The heat exchanger 472 can be air cooled, or a secondary fluid loop for liquid-to-liquid cooling can be connected to each heat exchanger 472 via a vertical manifold (not shown).

The configuration of the system 510 eliminates the need for the vertical supply and return manifolds 460, 466 of the systems 450, 500. In addition, the configuration of the system 510 allows room for an additional row 456 of the devices 452 on the rack 454 compared to the system 500 in FIG. 20. In addition, keeping the cooling fluid loops in each row 456 allows the pumping by the pumps 470 to be more efficient and simplifies flow proportioning to the devices 452.

FIGS. 24-27 illustrate another embodiment of a liquid submersion cooled electronic system 520. The system 520 includes a plurality of device housings 522 supported on a rack 524 in an array composed of a plurality of vertically spaced rows 526 of the housings 522. Each row 526 is illustrated as including a plurality of the housings 522. However, each row 526 can include a single one of the housings 522. In addition, vertical rows are not required, and a plurality of the housings 522 can be disposed in a single horizontal array.

Each of the housings 522 includes a liquid tight bottom tray 528 that defines an interior space that is intended to contain the cooling liquid, and a removable top cover 530 disposed over the tray 528 that closes off the interior space and prevents ingress of contaminants into the cooling liquid in the tray 528.

Figure 25:
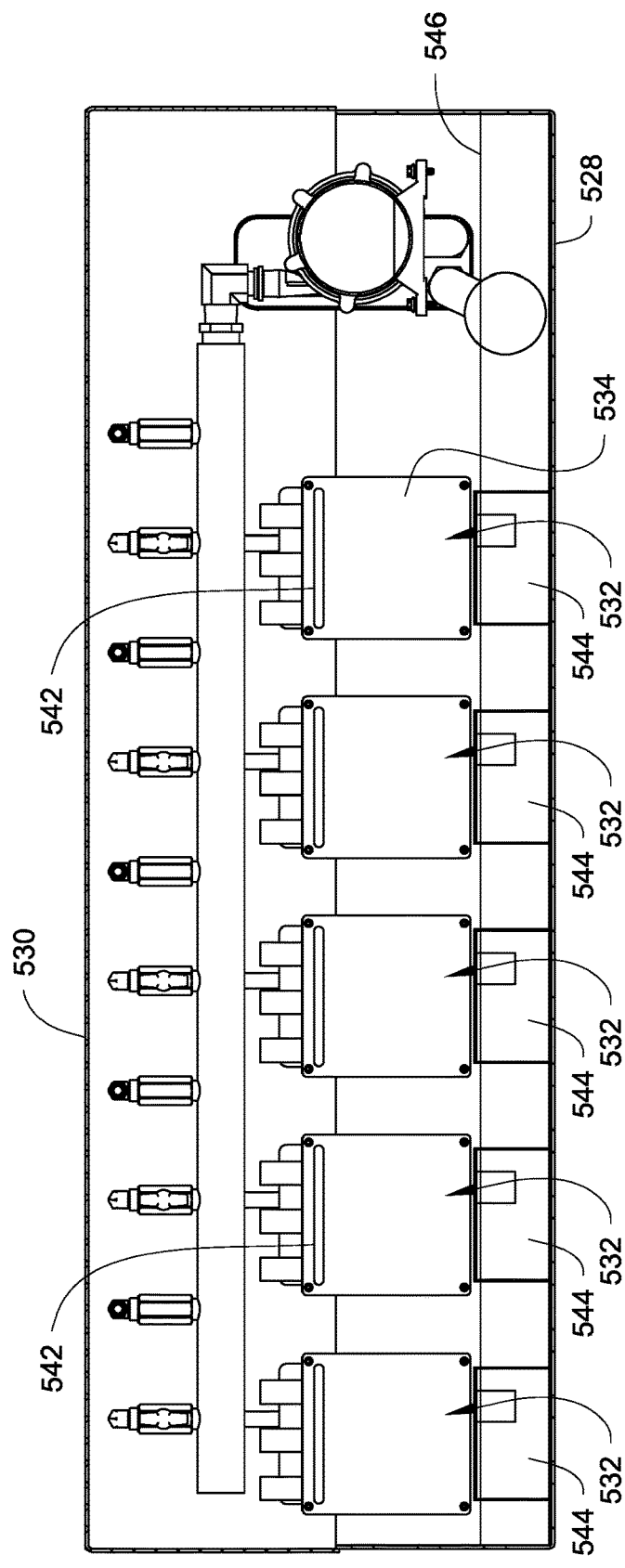
FIG. 25 is a front view of one of the housings of the system in FIG. 24.
Figure 26:
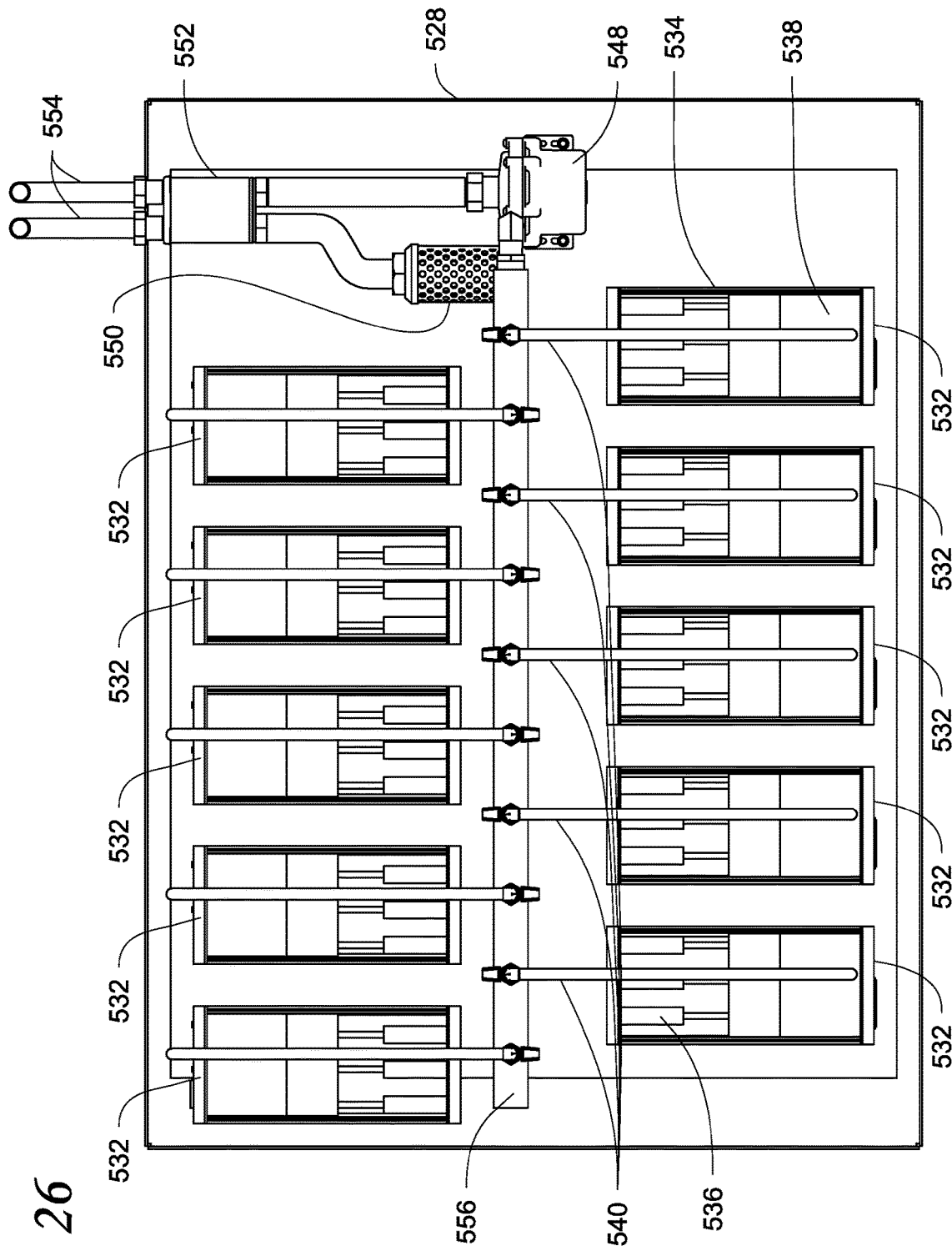
FIG. 26 is a top view of the housing in FIG. 25 with the top cover removed.
Figure 27:
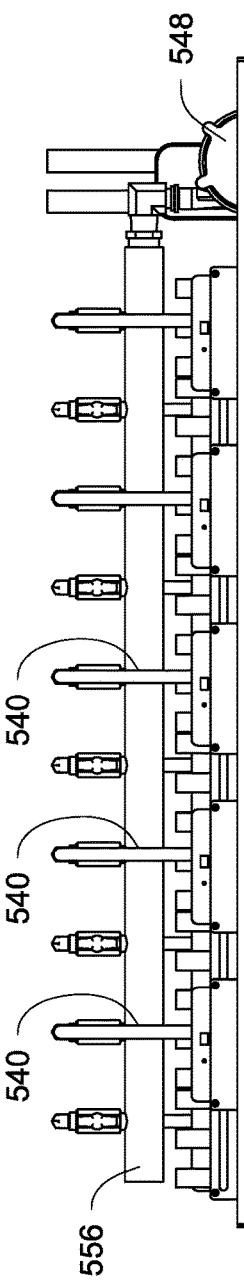
FIG. 27 is a front view of the housing in FIG. 26.

As best seen in FIGS. 25-27, a plurality of electronic devices 532 are disposed within each of the housings 522. Each of the devices 532 can be configured similar to the devices 204. In particular, each of the devices 532 can be configured as an Antminer® system which is bitcoin mining ASIC hardware as described above. In the illustrated example, ten of the devices 532 are illustrated in each one of the housings 532. However, a smaller or larger number of the devices 532 can be disposed in each of the housings 522.

Each of the devices 532 includes an open top device housing 534 defining an interior space containing heat generating electronic components 536. The device housings 534 are configured to contain the cooling liquid therein with at least some of the electronic components 536 submerged therein. As seen in FIG. 26, some of the electronic components can be covered by a dispersion plenum housing 538 whose function is similar to the dispersion plenum housings 126, 130 in FIGS. 4-5. Cooling liquid can enter each of the housings 534 via an inlet line 540 connected to each plenum housing 538 which constrains the entering cooling liquid as it flows over a heat generating component 536, such as a CPU or a GPU. The entering cooling liquid then enters the bulk cooling liquid contained in the housing 534. Cooling liquid exits each housing 534 via an exit opening or weir 542 (similar to the exit openings 220 in FIG. 7) formed in each housing 534, with the exiting cooling liquid then falling by gravity into the bulk liquid contained in the interior space of the tray 528.

In addition, at least some of the electronics of the devices 532 are submerged in the bulk cooling liquid that is contained within the bottom tray 528 of the housing 522. For example, as illustrated in FIG. 25, a power supply 544 for each device 532 can be disposed beneath each device 532, with each power supply 544 partially or fully submerged within the bulk cooling liquid in the tray 528. The bulk cooling liquid in the tray 528 can be maintained at a level 546 to ensure that the power supplies 544 or other electronics are adequately submerged.

The cooling liquid is circulated in the system 520 by a pump 548. The pump 548 can be disposed within the housing 522 or at any suitable location for performing its pumping function. The pump 548 has an inlet 550 that is disposed within the bulk cooling liquid within the tray 528, and pumps the cooling liquid to a heat exchanger 552 for cooling the cooling liquid. The heat exchanger 552 can be located within the housing 552 or at any suitable location for performing its heat exchange function. The heat exchanger 552 can be connected to an external cooling fluid loop 554 for example for liquid-to-liquid heat exchange, or the heat exchanger 552 can cool the cooling liquid via liquid-to-air heat exchange. The outlet of the pump 548 is connected to a supply manifold 556 within the housing 522 to which the inlet lines 540 are fluidly connected to return the cooled cooling liquid to each of the devices 532.

In the illustrated system 520, the cooling liquid never leaves the housings 522. The cooling liquid enters each of the housings 534 of the devices 532, cools the electronics therein, then exits the exit opening or weir 542 and falls by gravity into the bulk cooling liquid within the tray 528, where the cooling liquid is then pumped to the heat exchanger for cooling, and then pumped back into the housings 534 of each device 532. At the same time, the bulk cooling liquid in the tray 528 cools the power supplies 544 and any other portions of the system 520 in contact with the cooling liquid. The configuration of the system 520 eliminates the need for a separate fluid reservoir as well as supply and return manifolds.

Figure 28:
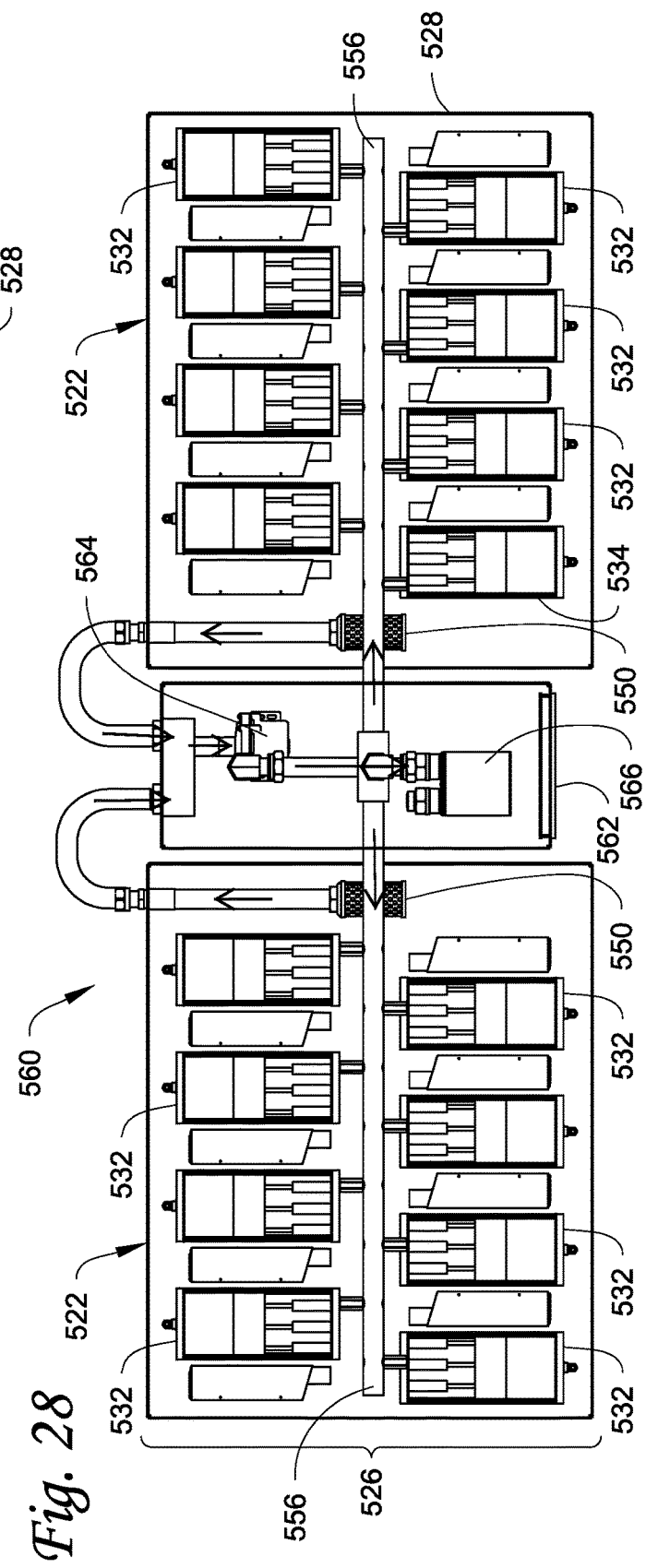
FIG. 28 is a top view similar to FIG. 26 showing an alternative system.

FIG. 28 illustrates another embodiment of a liquid submersion cooled electronic system 560 that is similar to the system 520 and like elements are referenced using the same reference numerals. In the system 560, the housings 522 in each row 526 share a pump and heat exchange module 562 that contains a pump 564 and a heat exchanger 566. The cooling liquid from the tray 528 of each housing 522 is pumped by the pump 564 to the heat exchanger 566 which cools the cooling liquid before returning the now cooled cooling liquid to the devices 532 via the supply manifolds 556. The heat exchanger 566 can be configured to cool the cooling liquid via heat exchange with a secondary coolant loop carrying a secondary coolant liquid, or if determined to be adequate the cooling can be achieved using air. The arrows in FIG. 28 illustrate the flow of the cooling liquid through the module 562. Since the housings 522 share the module 562, the cooling liquid can be shared between the two housings 522.

Figure 29:
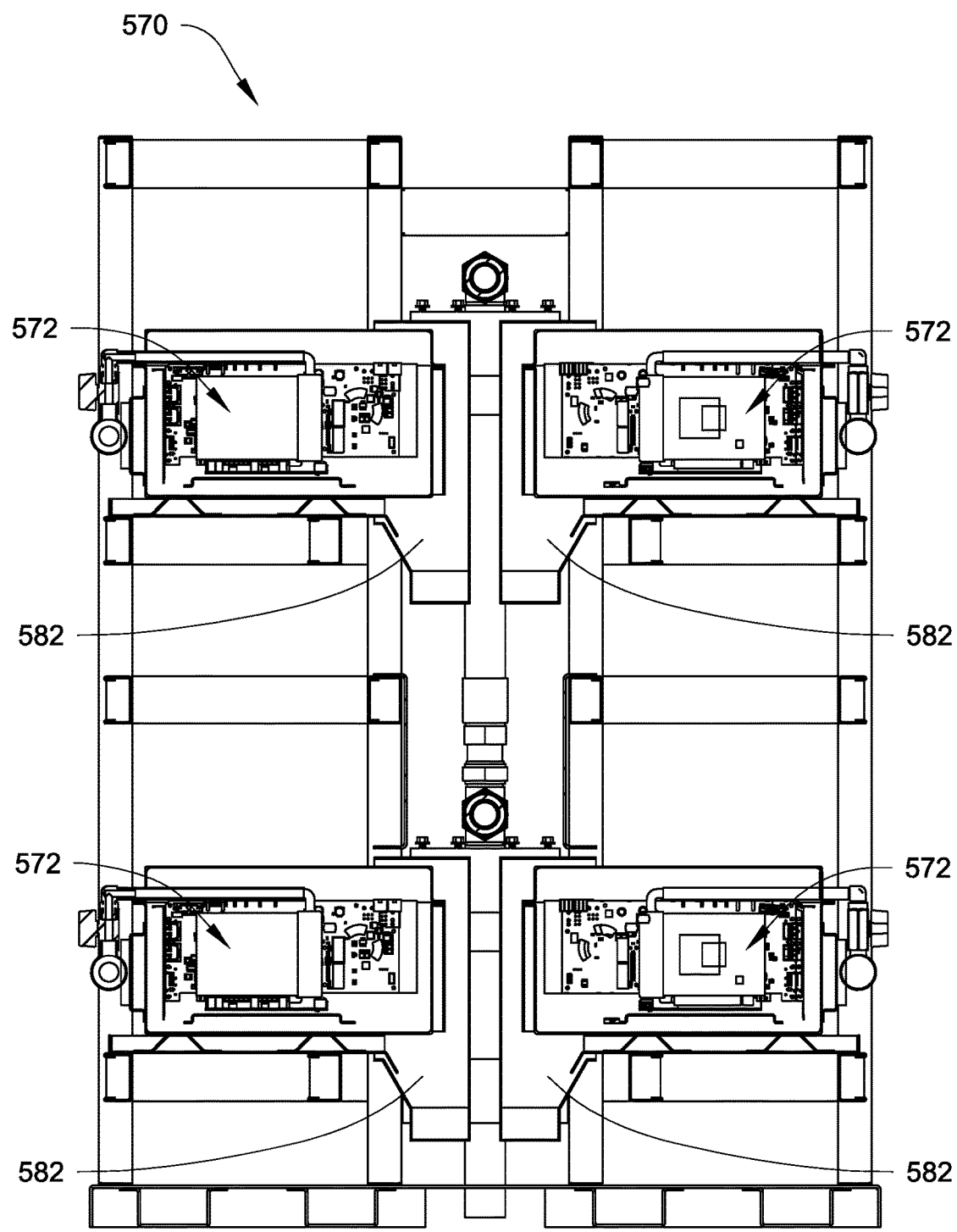
FIG. 29 is a side view of still another example of a liquid submersion cooled electronic system described herein.
Figure 30:
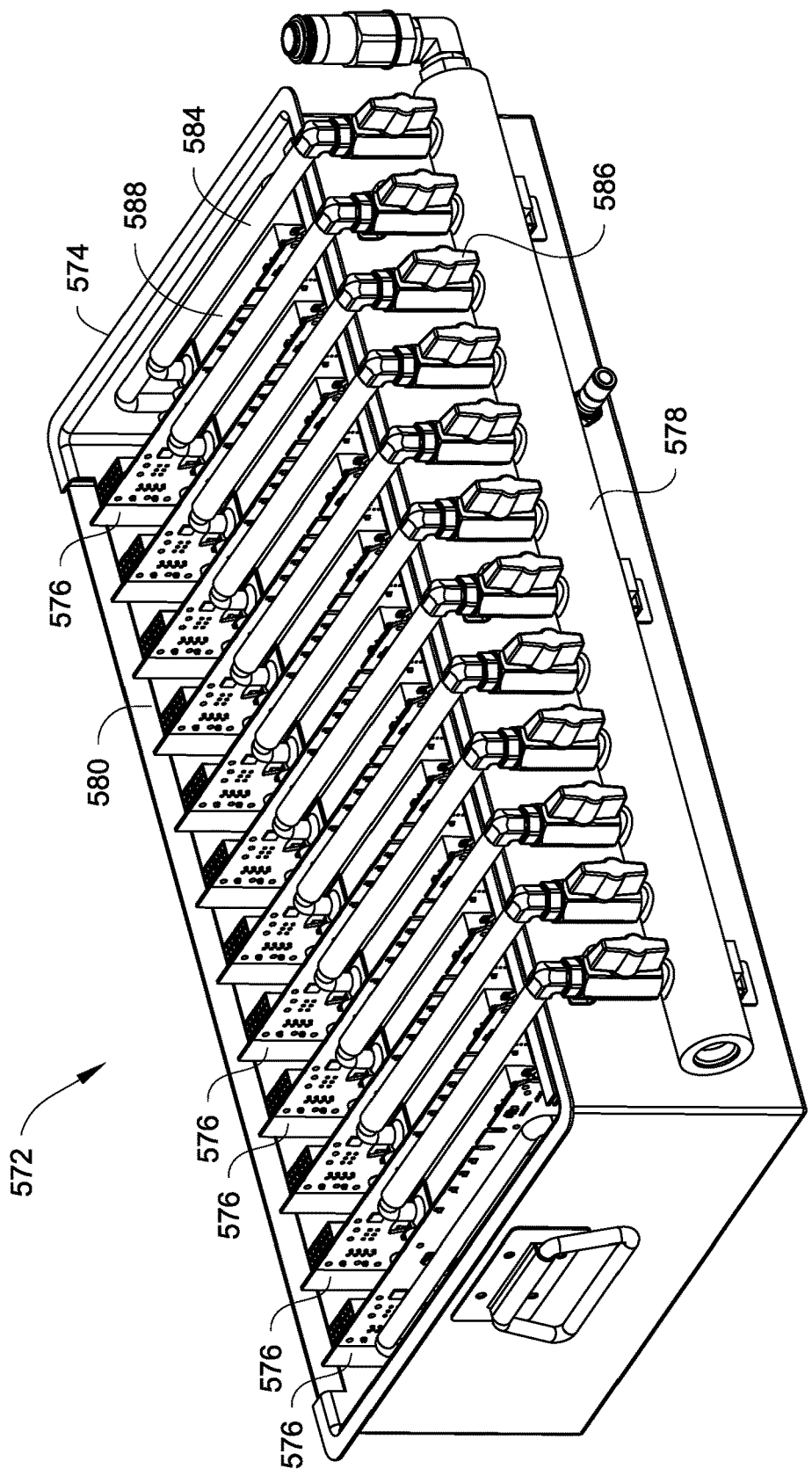
FIG. 30 is a perspective view of one of the electronic device housings in the system in FIG. 29.
Figure 31:
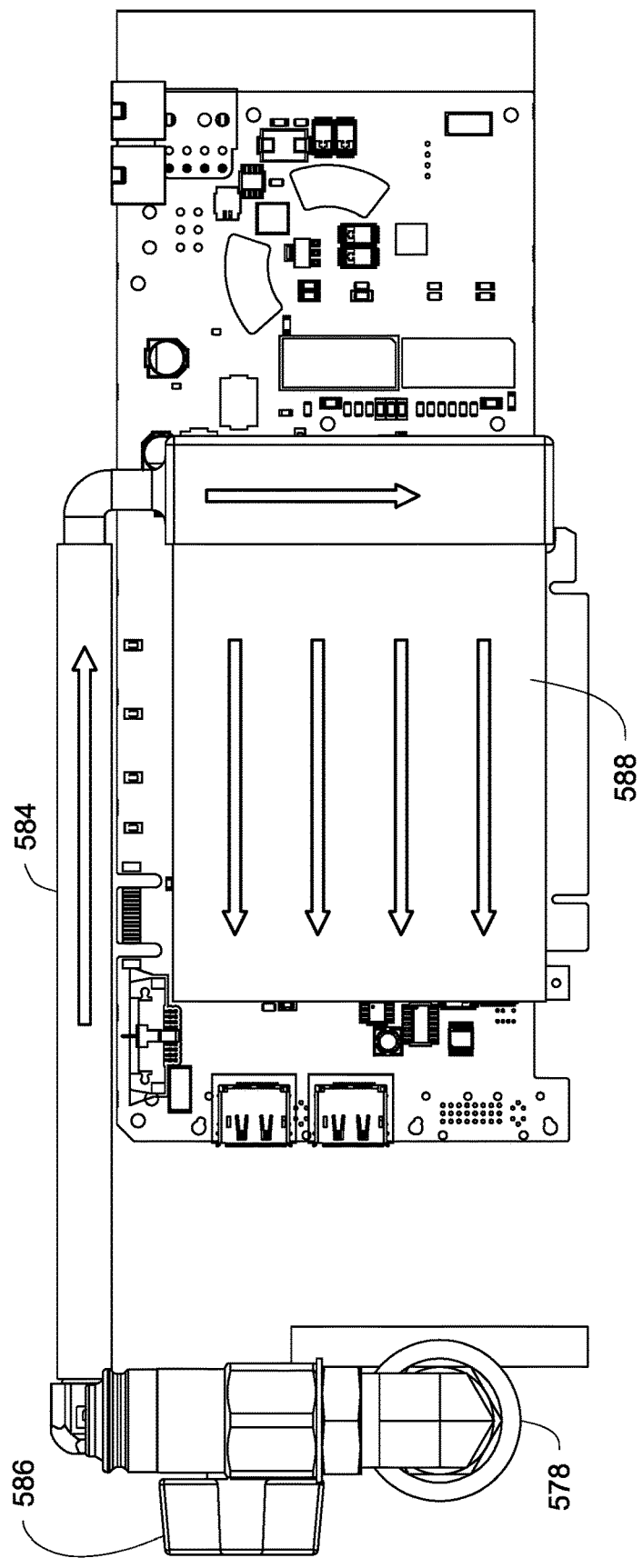
FIG. 31 is a side view of one of the electronic components in the device housing in FIG. 30.

FIGS. 29-31 illustrate another embodiment of a liquid submersion cooled electronic system 570. In this embodiment, the system 570 is configured as a dense GPU or CPU array with a plurality of electronic device housings 572 suitably supported on a rack. As seen in FIG. 30, each housing 572 comprises an open top, liquid tight tray 574 that can be covered by a removable cover if desired. The tray 574 is configured to contain a cooling liquid therein. A plurality of cards or circuit boards 576 are disposed within the tray 574. In the illustrated example, the cards 576 are arranged vertically and parallel to one another. The cards 576 are configured as graphics processing units (GPUs) or as central processing units (CPUs), with each card 576 having one or more processors mounted thereon.

A supply manifold 578 supplies returning cooling liquid, after being cooled, to each card 576. The supply manifold 578 is illustrated as being disposed outside of the interior space of the tray 574. However, the supply manifold 578 can be positioned at other locations. The opposite side of the tray 574 includes an exit opening or weir 580 through which cooling liquid exits the tray 574. As best seen in FIG. 29, cooling liquid that exits the openings 580 falls by gravity into return gutters or manifolds 582 that return the cooling liquid to a reservoir, where the liquid is cooled by a heat exchanger (not shown) and pumped by a pump (not shown) back to each row of housings 572 on the rack via a return manifold and ultimately into the supply manifolds 578 for return to the trays 574.

With reference to FIGS. 30 and 31, supply lines 584 extend from the supply manifold 578 to the cards 576. Flow through each supply line 584 can be controlled by a suitable valve 586. To enhance cooling, the processor(s) on the cards 576 can be enveloped by a dispersion plenum housing 588 that constrains the returning cooled cooling liquid as it flows over the processor(s) as indicated by the arrows in FIG. 31, before flowing into the bulk cooling liquid contained in the tray 574.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A liquid submersion cooled electronic device, comprising:
 a device housing defining an interior space and a maximum dielectric cooling liquid level;
 heat generating electronic components disposed within the interior space of the device housing;
 a dielectric cooling liquid in the interior space, the dielectric cooling liquid submerging and in direct contact with the heat generating electronic components;
 a dielectric cooling liquid inlet in the device housing through which dielectric cooling liquid enters the interior space; and
 a dielectric cooling liquid outlet weir in the device housing from which dielectric cooling liquid exits the interior space, the dielectric cooling liquid outlet weir is disposed at the maximum dielectric cooling liquid level of the device housing wherein the cooling liquid outlet weir establishes the level of the dielectric cooling liquid within the interior space and establishes a volumetric rate of flow of the dielectric cooling liquid within the interior space that is needed for the cooling of the heat generating electronic components.

2. The liquid submersion cooled electronic device of claim 1, wherein the device housing includes a first side and a second side opposite the first side; the dielectric cooling liquid inlet is in the first side and the dielectric cooling liquid outlet weir is in the second side.

3. The liquid submersion cooled electronic device of claim 1, further including a manifold within the interior space, the manifold is fluidly connected to the dielectric cooling liquid inlet, and a tube extending from the manifold and directing a return flow of the dielectric cooling liquid directly onto one of the heat generating electronic components.

4. The liquid submersion cooled electronic device of claim 1, wherein the dielectric cooling liquid outlet weir is located on the device housing at a vertical level that is higher than the location of the dielectric cooling liquid inlet.

5. The liquid submersion cooled electronic device of claim 1, wherein the heat generating electronic components comprise bitcoin mining ASIC hardware.

6. The liquid submersion cooled electronic device of claim 1, wherein the heat generating electronic components include at least one of a power supply, a processor, and a switch.

7. A liquid submersion cooled electronic system, comprising:
 a plurality of the liquid submersion cooled electronic devices of claim 1;
 a dielectric cooling liquid delivery manifold, the dielectric cooling liquid delivery manifold includes at least one inlet, and a plurality of delivery outlets; each one of the delivery outlets is fluidly connected to the dielectric cooling liquid inlet of a respective one of the dielectric cooling liquid inlets to deliver the dielectric cooling liquid to the interior space of the respective device housing;
 a dielectric cooling liquid reservoir that is configured to supply the dielectric cooling liquid;
 a pump having a pump inlet that is fluidly connected to the dielectric cooling liquid reservoir and a pump outlet that is fluidly connected to the at least one inlet of the dielectric cooling liquid delivery manifold; and
 a dielectric cooling liquid gravity return manifold, each one of the dielectric cooling liquid outlet weirs are fluidly connected to the dielectric cooling liquid gravity return manifold, and the dielectric cooling liquid gravity return manifold is fluidly connected to the dielectric cooling liquid reservoir, whereby the dielectric cooling liquid that exits through the dielectric cooling liquid outlet weirs is returned by gravity to the dielectric cooling liquid reservoir by the dielectric cooling liquid gravity return manifold.

8. The liquid submersion cooling system of claim 7, wherein the plurality of the liquid submersion cooled electronic devices are arranged into an array comprising a plurality of vertically spaced rows, and the rows are disposed on a rack.

9. The liquid submersion cooling system of claim 8, wherein the dielectric cooling liquid reservoir is disposed at a base of the rack beneath the vertically spaced rows.

10. The liquid submersion cooling system of claim 8, further comprising a heat exchanger fluidly connected to the dielectric cooling liquid reservoir to cool the dielectric cooling liquid from the dielectric cooling liquid reservoir.

* * * * *